(12) United States Patent
Sen et al.

(10) Patent No.: US 11,817,326 B2
(45) Date of Patent: Nov. 14, 2023

(54) PRECISION RECONSTRUCTION FOR PANEL-LEVEL PACKAGING

(71) Applicant: PYXIS CF PTE. LTD., Singapore (SG)

(72) Inventors: Amlan Sen, Singapore (SG); Chian Soon Chua, Singapore (SG); Qing Feng Guan, Singapore (SG); Wai Hoe Lee, Singapore (SG)

(73) Assignee: PYXIS CF PTE. LTD., Singapore (SG)

( * ) Notice: Subject to any disclaimer, the term of this patent is extended or adjusted under 35 U.S.C. 154(b) by 63 days.

(21) Appl. No.: 17/492,694

(22) Filed: Oct. 4, 2021

(65) Prior Publication Data

US 2022/0028703 A1 Jan. 27, 2022

Related U.S. Application Data

(63) Continuation-in-part of application No. 16/814,961, filed on Mar. 10, 2020.

(30) Foreign Application Priority Data

Oct. 2, 2020 (SG) .............................. 10202009834T

(51) Int. Cl.
*H01L 21/56* (2006.01)
*H01L 21/66* (2006.01)

(52) U.S. Cl.
CPC ............ *H01L 21/561* (2013.01); *H01L 22/20* (2013.01)

(58) Field of Classification Search
CPC .............................. H01L 21/561; H01L 22/20
(Continued)

(56) References Cited

U.S. PATENT DOCUMENTS 7,772,521 B2 * 8/2010 Smith, Jr. .......... B29D 30/0061
219/121.68
7,879,514 B2 * 2/2011 Phillipps ............. G03F 7/70475
430/30
(Continued)

FOREIGN PATENT DOCUMENTS

TW          M600061 U     2/2020

OTHER PUBLICATIONS

First Office Action received in TW corresponding application No. 110136936; dated Aug. 11, 2022.

*Primary Examiner* — Vu A Vu
(74) *Attorney, Agent, or Firm* — JAVALON LAW, PC.

(57) ABSTRACT

Panel level packaging (PLP) with high positional accuracy of dies. The PLP bonds dies accurately to die bonding regions of an alignment panel. High accuracy is achieved by providing die bonding regions with local alignment marks. Accurate die bonding on the alignment carrier results in a reconstructed wafer with accurate positioning of dies. The dies of the reconstructed wafer can be scanned by a die location check (DLC) scan based on sub-blocks of dies, enabling high DLC throughput. The DLC scan generates a DLC file with coordinate points of sub-blocks of the reconstructed wafer. Also, a laser direct imaging (LDI) file can be generated using sub-block circuit files aligned to the DLC file. The use of sub-block circuit files facilitates high throughput in generating the LDI file with high accuracy due to the reconstructed wafer being formed using the alignment carrier with local alignment marks.

19 Claims, 37 Drawing Sheets

(58) Field of Classification Search
USPC .............................................................. 438/5
See application file for complete search history.

(56) References Cited

U.S. PATENT DOCUMENTS

| | | | | |
|---|---|---|---|---|
| 9,401,014 | B2* | 7/2016 | Zafar | G06F 30/398 |
| 9,704,822 | B2* | 7/2017 | Knickerbocker | H01L 24/81 |
| 9,934,565 | B2* | 4/2018 | Amanullah | H01L 21/67259 |
| 9,985,003 | B2* | 5/2018 | Huska | G02F 1/133603 |
| 10,269,611 | B1* | 4/2019 | Tsai | H01L 21/67057 |
| 2017/0271160 | A1* | 9/2017 | Yen | H01L 21/76829 |
| 2019/0304852 | A1* | 10/2019 | Seyama | H01L 22/12 |
| 2019/0348392 | A1* | 11/2019 | Chen | H01L 24/799 |
| 2019/0355698 | A1* | 11/2019 | Guo | H01L 23/544 |
| 2020/0176437 | A1* | 6/2020 | Wimplinger | H01L 21/6836 |
| 2020/0182930 | A1* | 6/2020 | Lal | G01N 29/22 |
| 2020/0312780 | A1 | 10/2020 | Sen | |

* cited by examiner

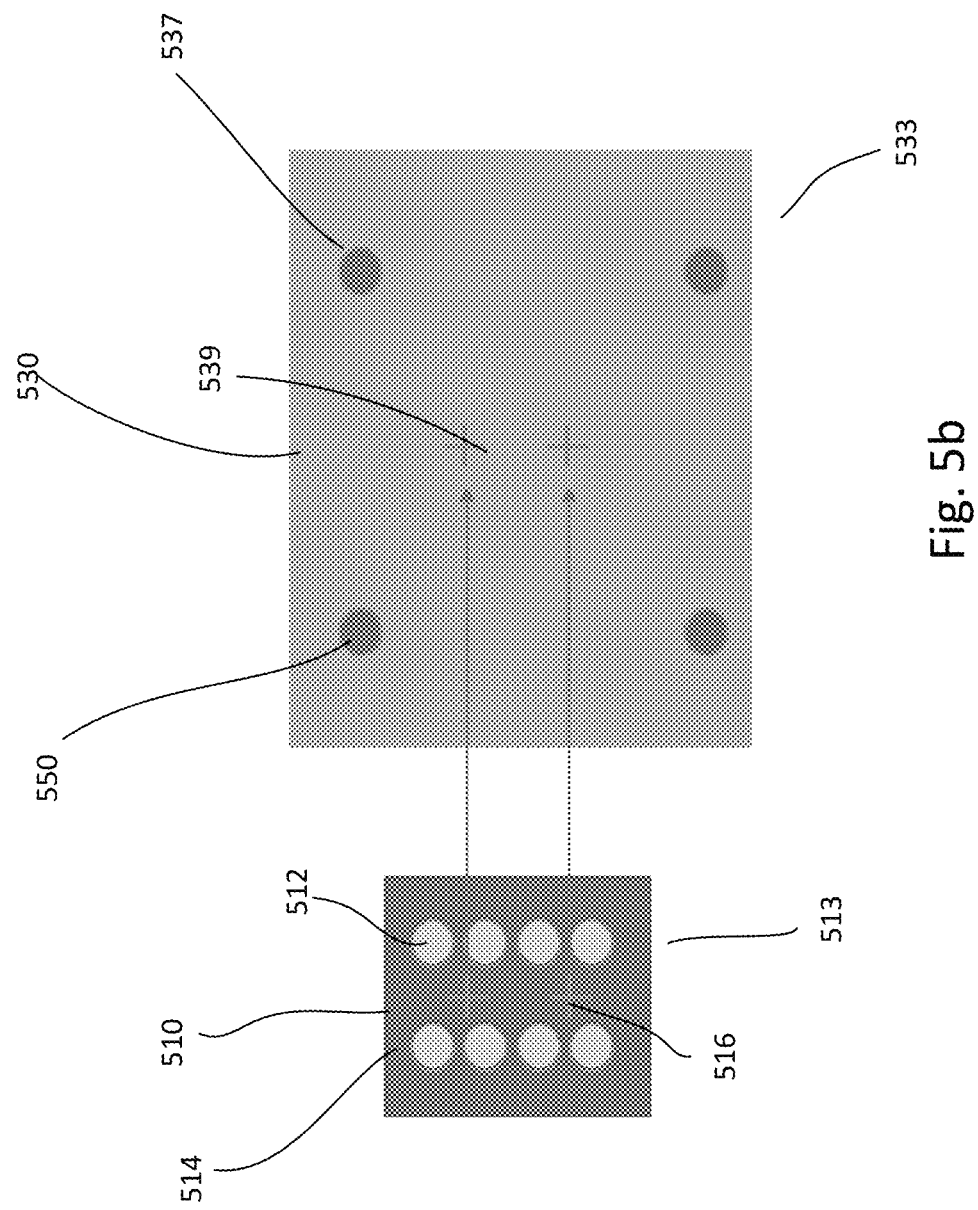

PRECISION RECONSTRUCTION FOR PANEL-LEVEL PACKAGING

CROSS-REFERENCE TO RELATED APPLICATIONS

This application claims the benefit of S.G. Provisional Application No. 10202009834T, filed on Oct. 2, 2020, and is a continuation-in-part of co-pending U.S. patent application Ser. No. 16/814,961, filed on Mar. 10, 2020, which claims the benefit of S.G. provisional Application No. 10201902757X, filed on Mar. 27, 2019, all of which are herein incorporated by reference in their entireties for all purposes.

FIELD OF THE INVENTION

The present disclosure relates to the precision reconstruction of panel-level packaged devices. In particular, the present disclosure relates to the bonding of dies on a panel for panel-level packaging with high precision.

BACKGROUND

Panel-level packaging (PLP) of devices has garnered significant interest in recent years. This is due to the larger volume of dies which can be packaged in parallel compared to conventional wafer level or substrate level packaging techniques. PLP involves attaching or bonding individual dies on a large panel or carrier for die bonding. For example, the dies are arranged in a matrix on the panel or carrier, with rows and columns of dies. A mold compound encases the dies, forming a mold panel or reconstructed wafer. The carrier, depending on its size, can accommodate significantly more dies than on a wafer, for example, 3 times to 5 times or more dies than a wafer. This increases packaging throughput as well as reduces costs. After the dies are packaged, the reconstructed wafer is sawed or diced to singulate the dies.

However, conventional techniques for forming the reconstructed wafer results in inaccurate positioning of the dies within the reconstructed wafer. Inaccuracy may be due to, for example, due to inaccurate alignment of dies to the carrier. In addition, the bonded dies may shift during processing, such as molding, further exacerbating the inaccuracy of the positioning of dies within the reconstructed wafer. Due to the misalignment of dies in the reconstructed wafer, downstream processing, such as forming traces to complete the packaging process and sawing the reconstructed wafer to singulate it into individual packages, may be misaligned. Such misalignment of downstream processes results in decreased yields.

Therefore, based on the foregoing discussion, it is desirable to provide accurate positioning of dies in a reconstructed wafer to increase yields.

SUMMARY

Embodiments of the present disclosure generally relate to panel-level packaged devices. In particular, the present disclosure relates to precision reconstruction for panel-level packaging.

In one embodiment, a method for a die location check (DLC) includes providing a reconstructed wafer having a block of dies encased in a mold compound. The block of dies includes a plurality of dies arranged in rows and columns to form a matrix of dies of the block. The plurality of dies includes alignment dies and live dies. The method further includes scanning the reconstructed wafer. The scanning includes scanning the block of dies. The method also includes processing scan information of the block of dies. The processing includes identifying positions of the alignment dies of the block of dies, assigning one of the alignment dies of the block of dies as an origin point of a Cartesian coordinate system of the block of dies, wherein scanning the block of dies includes scanning sub-blocks of dies one sub-block at a time, wherein each sub-block of dies includes the dies arranged in a sub-block matrix, the sub-block matrix includes a smaller number of dies than the matrix of the block of dies, and assigning coordinate points for the sub-blocks of dies in the Cartesian coordinate system.

In another embodiment, a method for bonding dies for panel level processing includes providing an alignment panel having a bonding surface which includes die bonding regions for bonding dies thereto. The bonding surface includes local alignment marks. The bonding surface includes a panel adhesive film for facilitating bonding the dies to the die bonding regions. The method further includes bonding a selected die to a selected die bonding region including aligning the selected die to the selected die bonding region using the local alignment marks of the selected die bonding region, and bonding the selected die to the selected die bonding region when the selected die is aligned to the selected die bonding region.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 5a-5b illustrate an embodiment of matching patterns of CAD files to the die and the alignment panel;

DETAILED DESCRIPTION

Embodiments generally relate to panel-level packaged devices, such as panel-level packaged semiconductor devices or integrated circuits (ICs). In particular, the present disclosure relates to the bonding of dies or devices on a panel for panel-level packaging with high precision.

Figure 1:
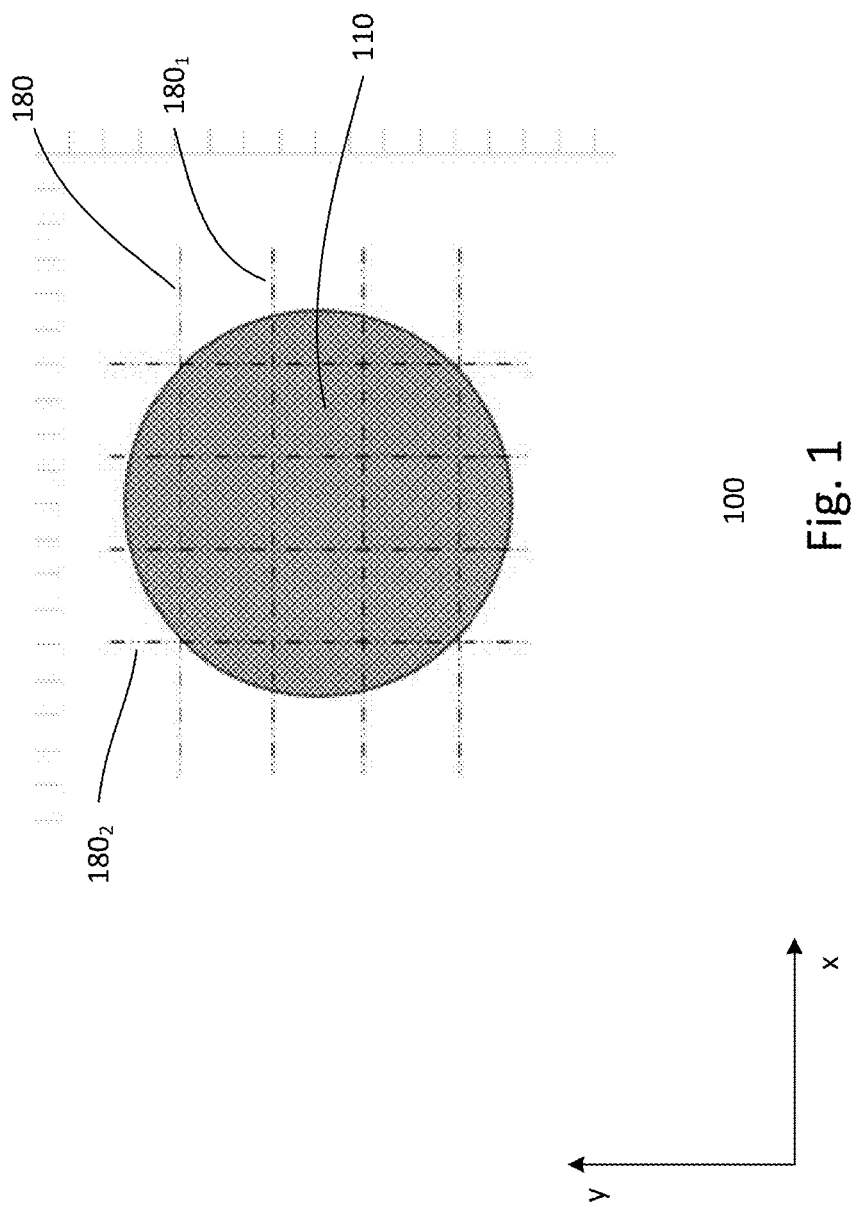
FIG. 1 shows a simplified top view of a semiconductor wafer.

FIG. 1 shows a simplified top view of a semiconductor wafer 100. The wafer may be a lightly doped p-type silicon wafer. Other types of wafers may also be employed. For example, the wafer may be a silicon carbide (SiC) wafer, a gallium nitride (GaN) wafer, a gallium arsenide (GaAs) wafer, or an indium phosphide (InP) wafer. Devices 110 are formed on an active surface of the wafer 100 in parallel. The active surface may be the top surface of the wafer 100. An inactive surface may be the bottom surface of the wafer.

The devices 110 are arranged in rows along a first (x) direction and columns along a second (y) direction. After processing of the wafer is completed, the wafer is diced along dicing or saw lines 180 with a wafer saw. For example, the wafer is diced along first dicing lines $180_1$ in the x direction and second dicing lines $180_2$ in the y direction to singulate the devices 110 of the wafer 100 into individual devices or dies 110.

Figure 2A:
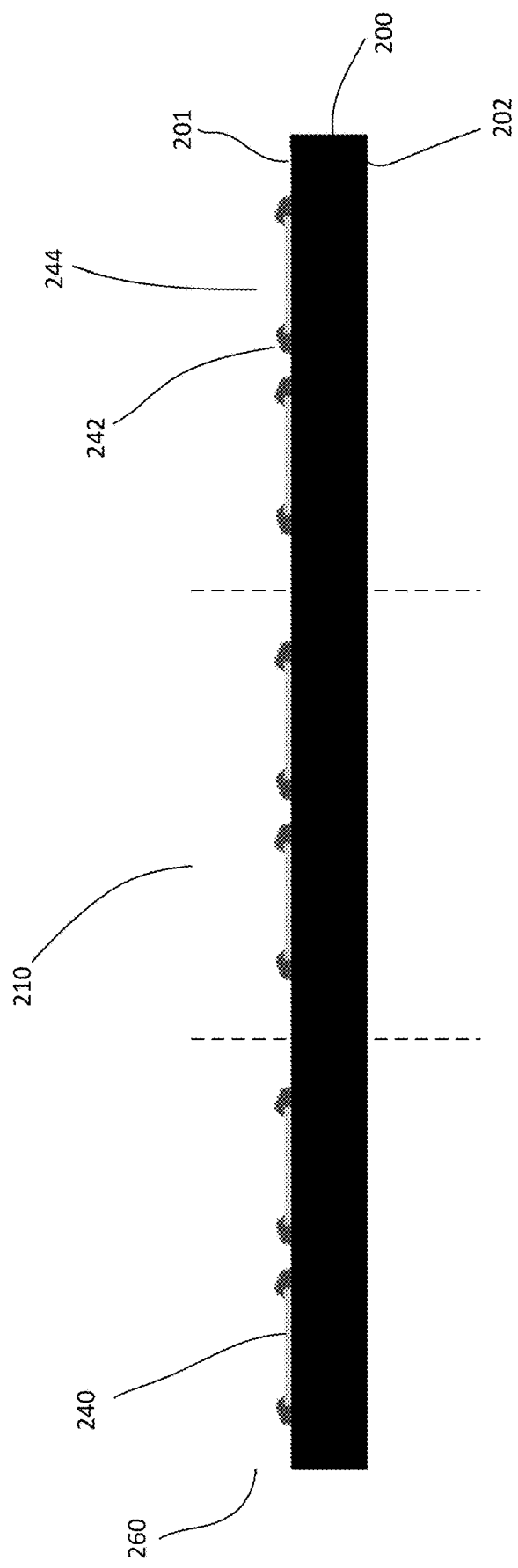
FIGS. 2a-2d show an embodiment of processing a processed wafer.

FIGS. 2a-2d show simplified cross-sectional views of a process for processing a processed wafer 200. Referring to FIG. 2a, the cross-sectional view of the processed wafer 200 is shown. The processed wafer 200 includes a top or active processed wafer surface 201 and a bottom or inactive processed wafer surface 202. Illustratively, the cross-sectional view of the processed wafer 200 includes 3 dies 210 for purpose of simplifying the description. It is understood that the cross-sectional view may include other numbers of the dies 210 as well as other elements which are not shown, such as portions of dies at the edges of the wafer. The processed wafer 200 may be an incoming processed wafer from an external supplier. For example, a packaging vendor may receive the processed wafer 200 from the external supplier, such as a wafer processing fab.

In one embodiment, a bare wafer is processed to form the processed wafer. Processing, for example, includes forming circuit components or elements of the dies 210 on the surface of the wafer. The circuit components may include active and inactive circuit components. Active components may include, for example, transistors, diodes, and triodes, while passive components include voltage elements, capacitors, resistors, and inductors. Other types of active and passive components may also be included. The circuit components may be formed using a series of processes, such as doping (e.g., implantation or diffusion), depositing (e.g., oxidation, chemical vapor deposition (CVD), plating, and sputtering), and patterning (e.g., lithography and etching). Other techniques may also be employed to form the circuit components.

A BEOL dielectric with multiple interconnect levels having conductive lines coupled to via contacts is formed on the die substrate. The BEOL dielectric, for example, covers the die substrate surface with the circuit components. The BEOL dielectric, in one embodiment, includes low-k dielectrics or dielectric layers isolating the conductive lines of the different interconnect levels. The low-k dielectric layers may also include ultra low-k dielectric layers. Low-k dielectrics or dielectric layers may collectively refer to low-k dielectrics or dielectric layers and ultra low-k dielectrics or dielectric layers. Other types of dielectric layers may also be useful. The circuit components and the BEOL dielectric are simply shown as part of the processed wafer 200. The top of the BEOL may be the active processed wafer surface 201.

The top of the BEOL dielectric may include a pad level. The pad level, in one embodiment, includes die bond pads 240. The die bond pads 240, for example, may be aluminum (Al) die bond pads 240. Other types of die bond pads 240, such as copper (Cu), nickel (Ni), palladium (Pd), gold (Au), chromium (Cr) or a combination or alloys thereof, including Al—Cu, may also be useful.

The die bond pads 240 may be covered by a passivation layer 242. The passivation layer may be a passivation stack with multiple dielectric layers. For example, the passivation stack may include a combination of dielectric layers, such as silicon oxide and silicon nitride layers. Other types of dielectric layers may also be useful.

The passivation layer 242 may include pad openings 244 to expose the die bond pads 240. As shown, the pad openings 244 are smaller than the die bond pads. For example, the passivation layer 242 has a top surface which is above the top surface of the die bond pads 240, with the pad openings 244 being smaller than the die bond pads 240. As shown, the passivation layer 242 covers an edge portion of the die bond pads 240. The pad openings 244 may be formed by, for example, an anisotropic etch, such as a reactive ion etch (RIE). Other types of etching may also be used to form the pad openings. Exposed portions of the top of the BEOL dielectric, the passivation layer 242, and the bond pads 240 may collectively be referred to as the active processed wafer surface 201. In some cases, the active processed wafer surface 201 may include the top of the BEOL dielectric and the die bond pads 240, but no passivation layer.

Figure 2B:
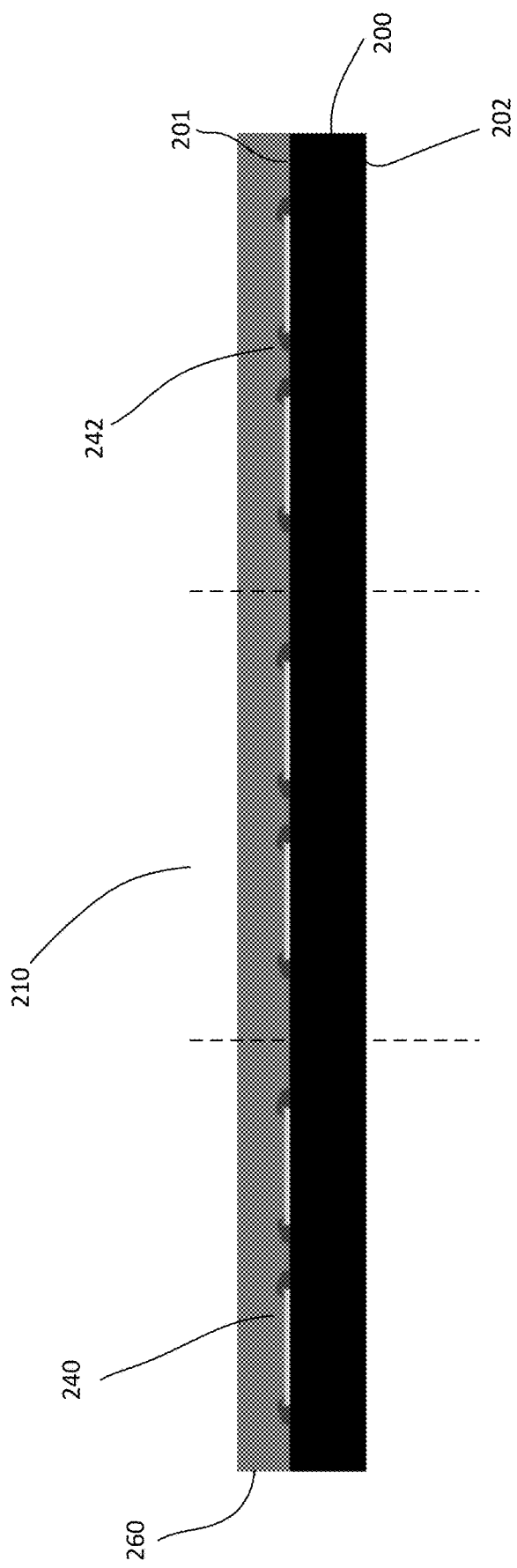

In FIG. 2b, the processed wafer 200 is further processed. In one embodiment, further processing of the processed wafer 200 includes forming a buffer layer 260 on the active processed wafer surface 201. For example, the buffer layer 260 is a wafer-level buffer layer 260 which is formed on the active processed wafer surface 201. The buffer layer 260 is a dielectric buffer layer. The buffer layer 260, for example, may include an epoxy resin, polyimide, polybenzoxazole, or other types of dielectric materials. The thickness of the buffer layer 260 may be about 10-100 um, about 15-100 um, about 20-100 um, about 25-100 um, about 45-100 um or about 60-100 um. Other thicknesses for the buffer layer 260 may also be useful.

In a preferred embodiment, the buffer layer 260 prevents or reduces chipping or cracking of the BEOL dielectric from the wafer singulation process, such as dicing to separate the wafer 200 into individual dies 210. The buffer layer 260 may be tuned to have or have a Young's Modulus and Breaking Strength to reduce or prevent chipping or cracking in the BEOL dielectric from the wafer singulation process. In one embodiment, the Young's Modulus of the buffer layer 260 is about 10,000-25,000 MPa, about 14,000-25,000 MPa, about 15,000-25,000 MPa, about 16,000-25,000 MPa, about 15,000-20,000 or about 20,000-25,000 MPa. As for the Breaking Strength, it may be about 45-150 MPa, about 70-150 MPa, about 70-120 MPa, about 70-105 MPa, about 80-120 MPa or about 90-120 MPa. A coefficient of thermal expansion (CTE) of the buffer layer 260, for example, may be about 6-20 ppm/K. The buffer layer may have a temperature stability through the region −65-+300° C.

In one embodiment, the buffer layer 260 is a composite buffer layer 260 which includes a base buffer layer with filler particles. In one embodiment, the base buffer layer includes an organic polymer matrix material. The base buffer layer, for example, may include thermosetting plastics or thermoplastics, such as polyimides, epoxy resins, as well as other types of polymers. In one embodiment, the base buffer layer includes a resin, such as epoxy or cyanate esters. Preferably, the base buffer layer is a low viscosity resin, such as a biphenyl epoxy resin. Other types of base buffer layers may also be useful.

In one embodiment, the fillers are inorganic-based. For example, the fillers may be silica ($SiO_2$), amorphous aluminum oxide ($\alpha$-$Al_2O_3$), or a combination thereof. Other types of fillers may also be useful. For example, the fillers may be organic-based or a combination of inorganic-based or organic-based fillers. The fillers, for example, may be spherical-shaped fillers. The fillers of the composite buffer layer 260 are non-uniformly sized fillers ranging from about 0.5-12 um or about 0.5-10 um in diameter. Other sized fillers or shaped fillers may also be useful.

The buffer layer may be formed on the active processed wafer surface 201 using various techniques. For example, the buffer layer 260 may be formed by spin coating or lamination. Other techniques, such as slit die coating may also be useful. The technique used to form the buffer layer 260 may depend on the type of buffer layer.

Figure 2C:
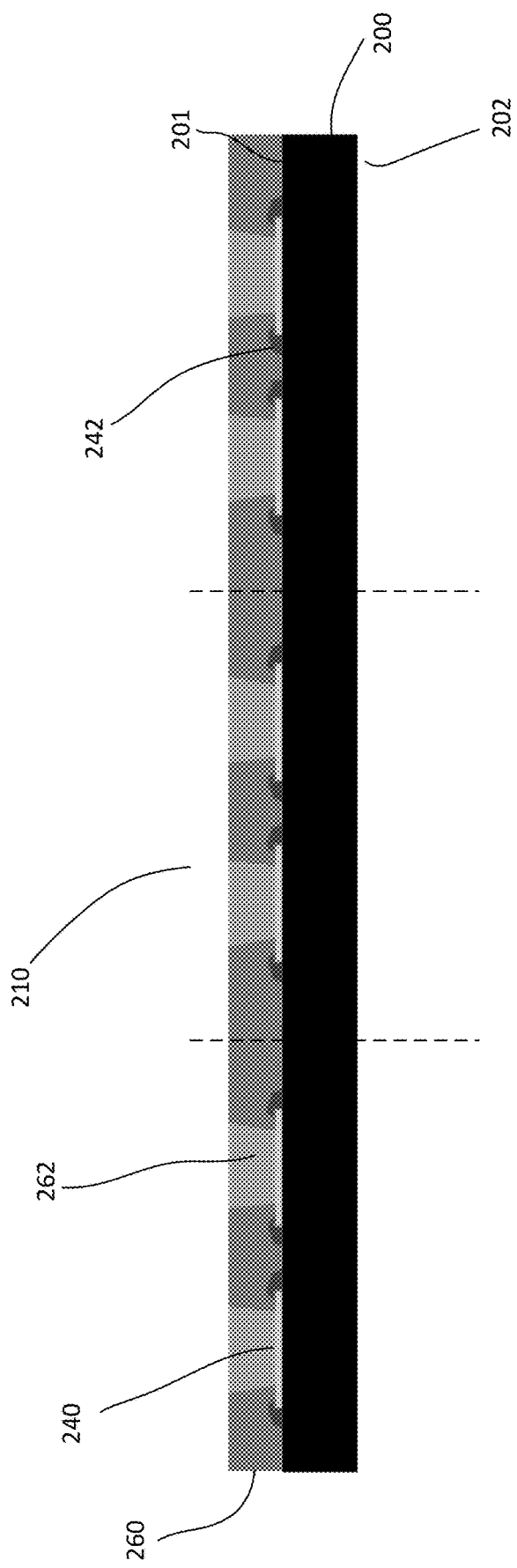

Referring to FIG. 2c, the buffer layer 260 on the active processed wafer surface 201 of the processed wafer 201 is patterned to form via openings 262. The via openings 262 expose the die bond pads 240. In one embodiment, the via openings 262 are formed by laser etching. Other processes for forming the via openings 262 may also be useful. As shown, the via openings 262 may have a slanted or tapered sidewall profile. Providing the via openings 262 with non-slanted sidewalls may also be useful. Also, as shown, the bottom of the via openings 262 is smaller than the die pads 240. Preferably, the bottom of the via openings 262 is positioned to be at about or as close as possible to a central portion of the die bond pads 240.

Figure 2D:
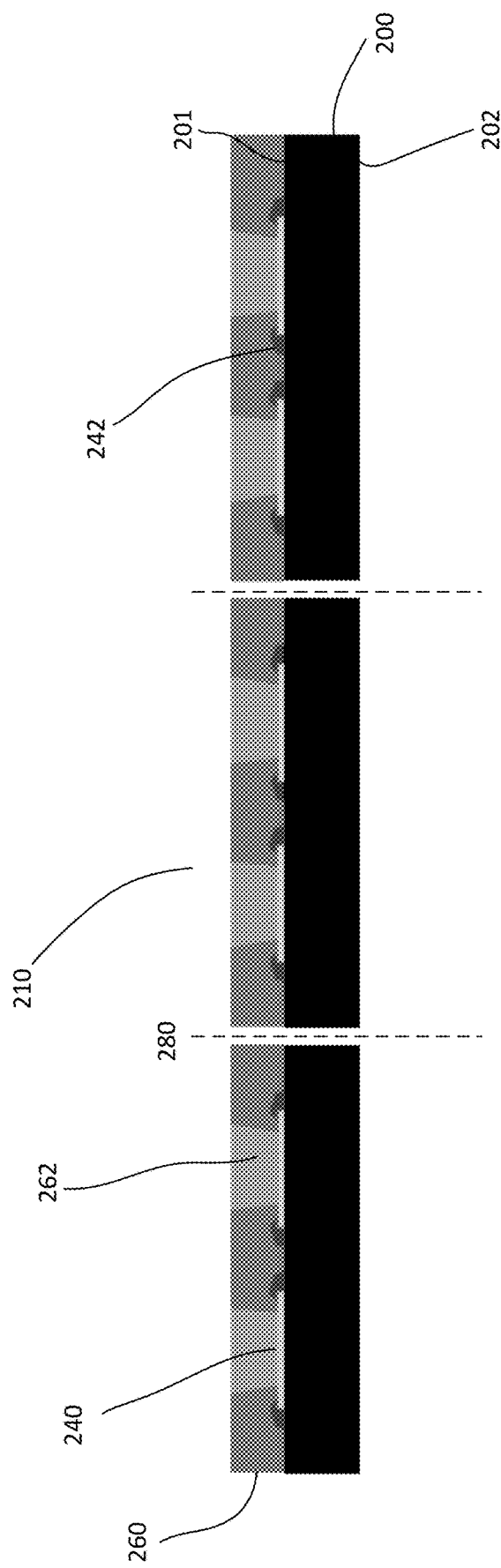

As shown in FIG. 2d, the processed wafer 200, after forming the via openings 262 in the buffer layer 260, is singulated into individual dies 210. For example, the processed wafer 200 is sawed at the dicing lines to singulate the processed wafer 200 into individual dies 210.

Figure 3A:
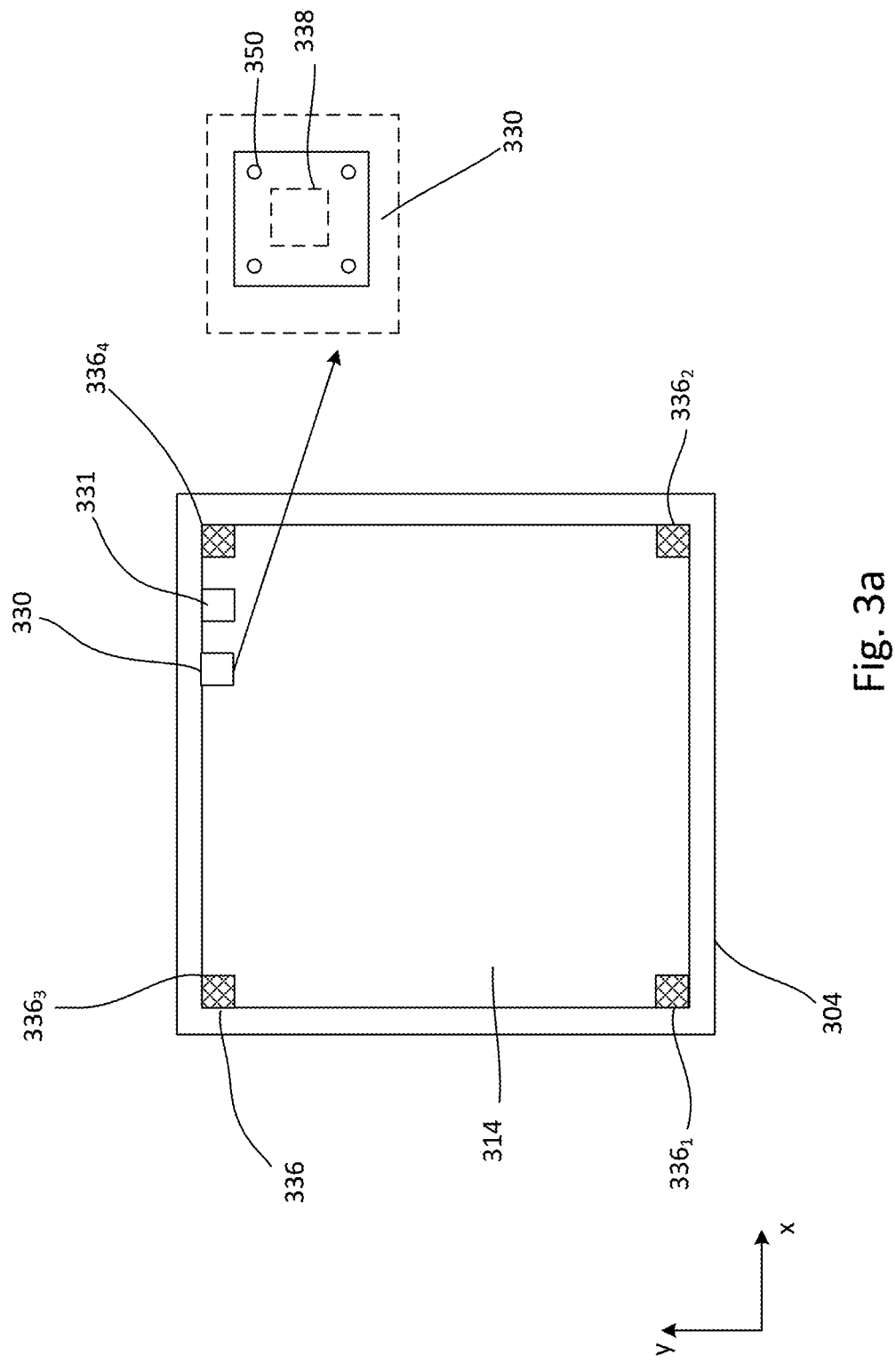
FIG. 3a shows a simplified top view of an embodiment of an alignment panel.

FIG. 3a shows a simplified top view of an embodiment of an alignment carrier or panel 304 used in PLP. For example, the top view may be of a top surface 305 of the alignment carrier on which dies are bonded for PLP. The top surface 305, for example, may be referred to as the bonding surface of the alignment panel 304. An opposing surface of the top surface 305 is a bottom surface 306 of the alignment carrier 304. The bottom surface 306 may be referred to as the non-bonding surface of the alignment panel 304. As shown, the alignment panel 304 is rectangular-shaped. The alignment panels 304 may be formed in other shapes.

In a preferred embodiment, the alignment panel 304 is formed of a material having a low coefficient of expansion (CTE) to minimize linear variation during temperature changes. The alignment panel 304, for example, may be formed of a material having a CTE at or below 8 ppm/K. Furthermore, the material should be robust enough to withstand handling during the bonding process. In addition, the material should preferably be magnetic, enabling the alignment panel 304 to be held firmly during grinding processes which are part of the overall bonding process. For example, the low CTE material may include Alloy 42 (CTE 3-4.5 ppm/K) and Alloy 46 (CTE 7-8 ppm/K). Other types of low CTE materials may also be used to form the alignment panel 304. Forming the alignment panel 304 using other materials as well as materials with other CTEs, including those having a CTE above 8 ppm/K may also be useful. The size of the alignment panel 304 may be about 700 mm×700 mm. Providing alignment panels having other sizes, larger or smaller, may also be useful.

The bonding surface 305 of the alignment panel 304, in one embodiment, includes an active region 314 with die bond regions 330. The die bond regions 330 may be arranged in a matrix format, with rows and columns of die bond regions 330 in first (row) and second (column) directions. The row direction, for example, is in the x direction and the column direction is in the y direction.

As shown, the die bond regions 330 in the active region 314 are arranged as one block or matrix. The spacing of die bond regions within one block is the same. For example, the spacings of adjacent die bond regions 330 in the row direction (row spacings) of the block are the same; the spacings of adjacent die bond regions 330 in the column direction (column spacings) of the block are the same. The row and column spacings may be the same or different from each other.

In some embodiments, the die bond regions 330 of the alignment panel 304 may be arranged in a plurality of blocks. For example, the die bond regions 330 of the alignment panel 304 may be arranged in 4 separate blocks of die bond regions 330, such as a 2×2 block matrix or arrangement. Other numbers of blocks or arrangements of the blocks may also be useful. For example, the alignment panel 304 may include an odd number of blocks arranged in a row or column format. The blocks, for example, are physically separated by block spacings. For example, adjacent blocks are separated by block spacings. The block spacings are larger than the die spacings (row and column die spacings between dies) within the block. Block may be used to refer to all die bond regions of an alignment panel, in the case that the alignment panel includes only one block, or to all die bond regions 330 within one block of an alignment panel with multiple blocks.

Dies are bonded to the die bond regions 330 of the block. In one embodiment, the die bond regions 330 include local die alignment marks or fiducials 150. The local die alignment marks facilitate aligning dies for bonding them to the die attach regions 338 of die bond regions 330. For example, each die bond region 140 includes its own local die alignment marks 350 for aligning and bonding one or more dies to the die attach region 352. The die attach region 352, for example, may be an outline of the die or dies when bonded thereto. As shown, the local die alignment marks 350 have a circular shape. Other shapes for the local die alignment marks 350 may also be useful. Preferably, all the local die alignment marks 350 have the same shape. However, it is understood that not all the local die alignment marks 350 need to have the same shape.

The die local alignment marks 350, in one embodiment, are preferably located outside of the die attach region 338. For example, the local die alignment marks 350, as shown, surround the die attach region 338. In some cases, the local die alignment marks 350 are disposed within the die attach region 338. In such cases, the local die alignment marks 350 are not visible after die bonding since the die will cover them up. In other embodiments, the local die alignment marks 350 may be disposed within and outside of the die attach region 338. Providing the local die alignment marks 350 outside of the die attach region 338 advantageously facilities post bonding inspection since they are visible after die bonding.

The die bond regions 330 may accommodate a single die or multiple dies, such as a multi-chip module (MCM). For example, each die bond region 330 may include multiple die attach regions. In the case of an MCM, providing local die alignment marks outside the die attach regions of the multiple dies advantageously enables the local alignment marks 350 to be commonly used for bonding the multiple dies onto the die bond regions 330. If the local die alignment marks 350 are disposed within the die attach region of one of the dies, additional local die alignment marks 350 may need to be provided for die bonding of the other dies of the MCM to their respective die attach regions within the die bond regions 330.

In one embodiment, the local die alignment marks 350 are detectable by a collinear vision camera for alignment. Such cameras may be described in, for example, U.S. Ser. No. 16/814,961, which is herein incorporated by reference for all purposes. The local die alignment marks 350 may be formed on the die bond regions 330 of the alignment panel 304 using, for example, laser drilling. Other techniques for forming the local die alignment marks 350 may also be useful. Preferably, the local die alignment marks 350 are shallow marks, facilitating removal by grinding to recycle the alignment panel 304. For example, the local die alignment marks 350 may be removed and new ones are formed for die bonding of another or a different type of die, such as when a die is no longer in production.

Providing the local die alignment marks 350 for each die bond region 330 improves the positional accuracy of die bonding, as compared to calculating die bond positions based on global alignment marks, as is conventionally done. Furthermore, by providing the local die alignment marks 350, effects of panel distortion or other positioning errors are minimized, improving positional accuracy of dies on the alignment panel 304, thereby improving yield and scalability.

The die bonding regions 330 of the block include alignment die bonding regions 336 and live die bonding regions 331. The live die bonding regions 331 accommodate live dies. Live dies are, for example, normal dies which are sold for use. The alignment die bonding regions 336 are similar to the live die bonding regions 331, except that they are designated for alignment dies. For example, the alignment die bonding regions 336 accommodate alignment dies which are used for alignment purposes. The alignment dies may be normal or live dies, such as the dies bonded in the live die bonding regions 331. For example, the alignment dies may be live dies which are also used for alignment purposes.

Alternatively, the alignment dies may be specifically used for alignment purposes. Providing specific alignment dies may be advantageous as they can be easily distinguished from normal or live dies. In such cases, the alignment dies are not for normal use. Preferably, the active surface of the alignment dies is processed with features which are easily detectable by the alignment camera. These features of the alignment dies produce contrast in the alignment image, making it easy to detect or distinguish from the live dies.

In one embodiment, the block includes at least 2 alignment die bonding regions 336. Providing the block with other numbers of alignment die bonding regions 336 may also be useful. As shown, the block includes 4 alignment die bonding regions $336_{1-4}$. The number of alignment die bonding regions may depend on, for example, the application. The alignment die bonding regions 336 are located in the block to facilitate determining die positions of the dies in the block of the reconstructed wafer by a die location check (DLC) process for further processing.

In one embodiment, the alignment die bonding regions $336_{1-4}$ are located at the corner die bonding regions of the block. For example, the alignment die bonding regions $336_{1-4}$ correspond to the first and last die bonding regions 330 of the first and last rows and the first and last columns of the block. Providing the alignment die bonding regions 336 at other locations of the block may also be useful. In the case that the alignment panel 304 includes multiple blocks, each block preferably has the same arrangement of alignment die bonding regions 336. However, it is understood that different blocks of the alignment panel 304 may have different arrangements of alignment die bonding regions 336, including the amount and positions of the alignment die bonding regions 336.

Figure 3B:
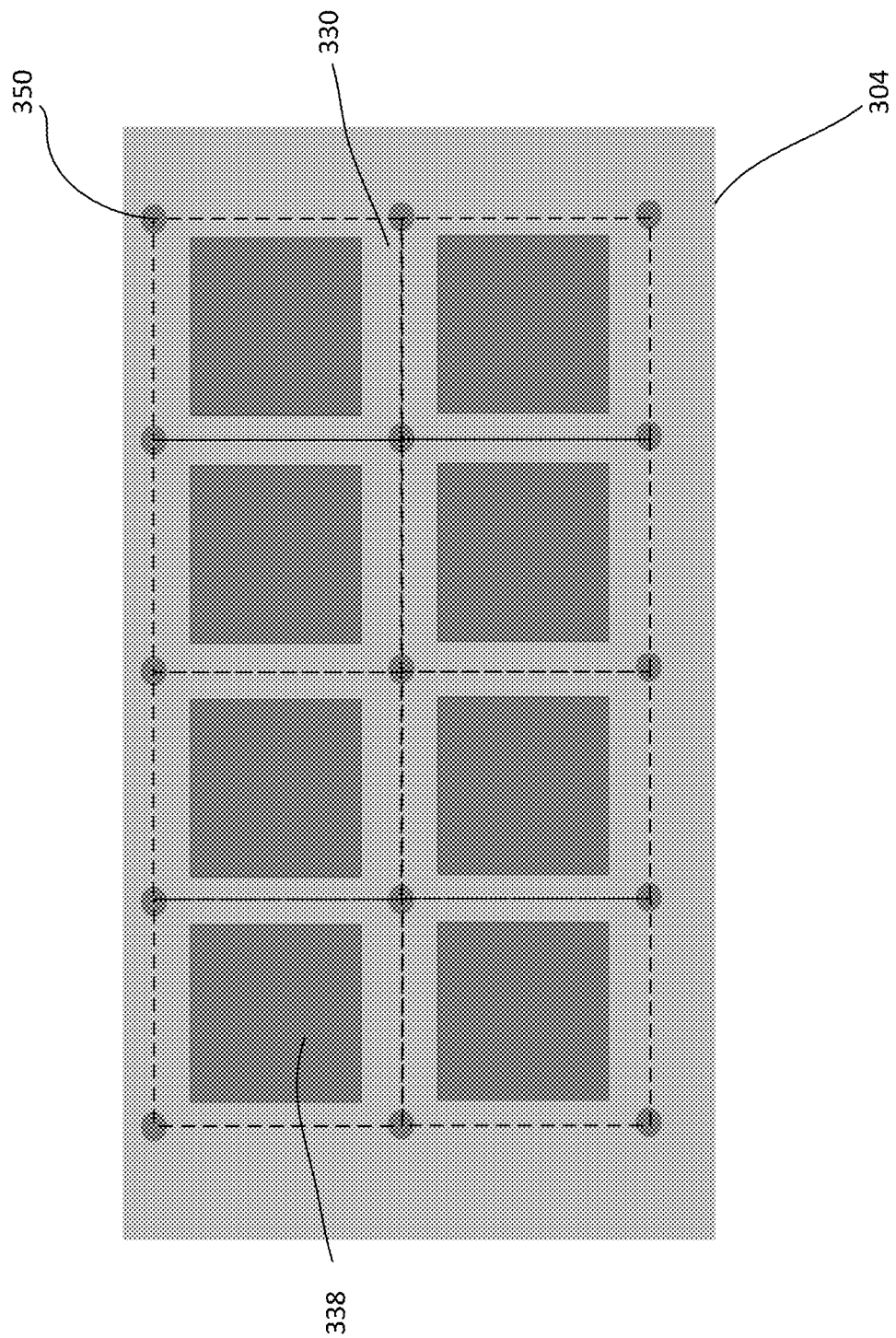
FIG. 3b shows a simplified top view of a portion of another embodiment of the alignment panel.

FIG. 3b shows a simplified top view of a portion of another embodiment of the alignment panel 304. As shown, adjacent die bonding regions 330 of the alignment panel 304 abut each other. Such an arrangement enables the local alignment marks 350 to be shared by adjacent die bonding regions 330. Sharing of the local alignment marks 350 between adjacent die bonding regions 330 reduces the footprint of the die bonding regions, enabling the alignment panel 304 to fit more die bonding regions 330.

As described, the alignment panel is formed of a metallic material with local die alignment marks. The use of a metallic material is advantageous as it allows a magnetic table to be used to hold the alignment panel firmly in place for processing. For example, a magnetic table may be employed to firmly hold the alignment panel in place for grinding the mold compound.

In other embodiments, the alignment panel 304 may be formed of glass or other types of transparent material. The local die alignment marks 350 may be formed on the transparent alignment panel 304. In other cases, the local die alignment marks 350 may be independent of the transparent alignment panel 304. For example, the local die alignment marks 350 may be formed on a separate mark sheet, such as paper or resin, and may be attached to the bottom or inactive surface of the transparent alignment panel 304. The adoption of the independent local die alignment marks 350 eliminates the need for a marking process on the alignment panel 304, and thus reduces manufacturing costs significantly.

Light from a camera module of a die bonder can penetrate through the transparent alignment panel 304 to detect the local die alignment marks 350 on the mark sheet. The adoption of the independent local die alignment marks 350 can be achieved easily, eliminating the need for the marking process on the alignment panel 304. Furthermore, providing the local die alignment marks 350 independent of a transparent alignment panel is advantageous since it avoids the need to mass-produce glass alignment panels with the local die alignment marks 350. This can result in significant savings since glass alignment panels 304 are fragile and the marking process is expensive.

Figure 4A:
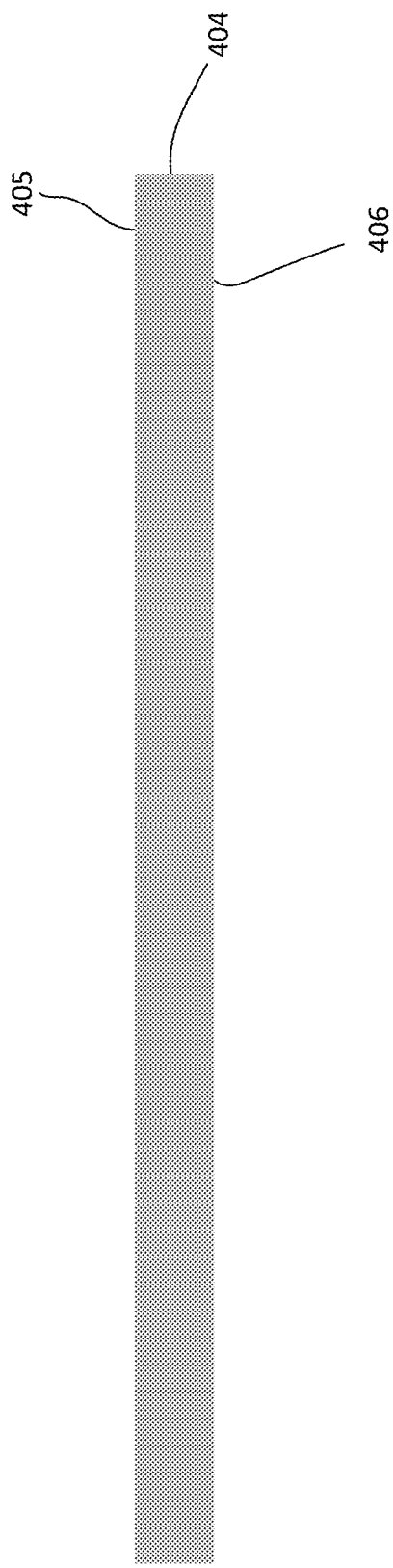
FIGS. 4a-4d show an embodiment of a process for preparing the alignment panel.

FIGS. 4a-4d show an embodiment of a process for preparing the alignment panel. Referring to FIG. 4a, a bare alignment panel 404 is provided. The alignment panel 404 includes opposing top and bottom surfaces 405 and 406. The alignment panel 404 may be formed of a low CTE material, such as Alloy 42 or Alloy 46. Other types of materials may also be used to form the alignment panel 404. The thickness of the alignment panel 404 may be about 2 mm for a 700 mm×700 mm panel. Other thicknesses for the alignment panel may also be useful. The thickness, for example, may depend on the size and material of the alignment panel 404.

Figure 4B:
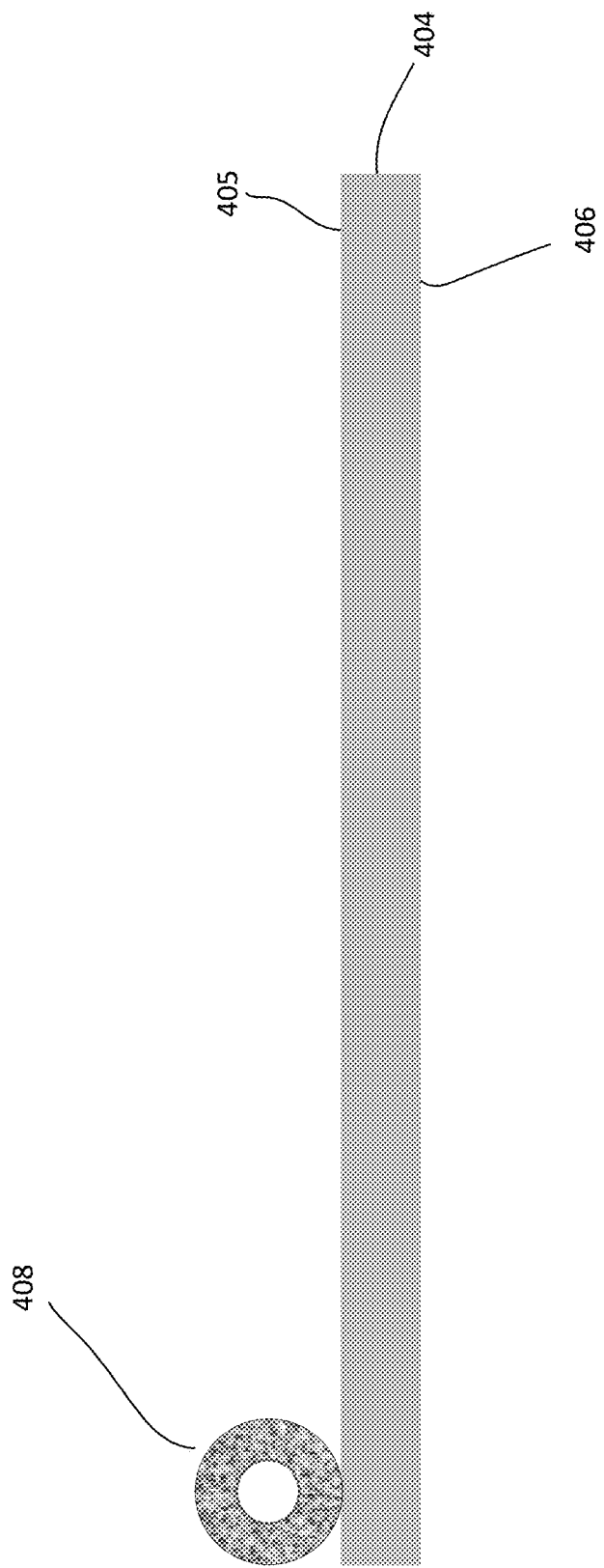

In FIG. 4b, the top or bonding surface 405 of the alignment panel 404 is prepared. In one embodiment, panel preparation includes grinding the top surface 405 to produce a parallel thickness for the alignment panel 404. The grinding process ensures the planarity of the alignment panel 404 as well as producing a scratch-free top or active surface 405. In some embodiments, the bottom or non-bonding surface 406 may similarly be ground to ensure that it is free of dents and burrs. In some embodiment, the bonding surface 405 of the alignment panel 404 may be hardened to inhibit scratches from being formed or panel discoloration.

Figure 4C:
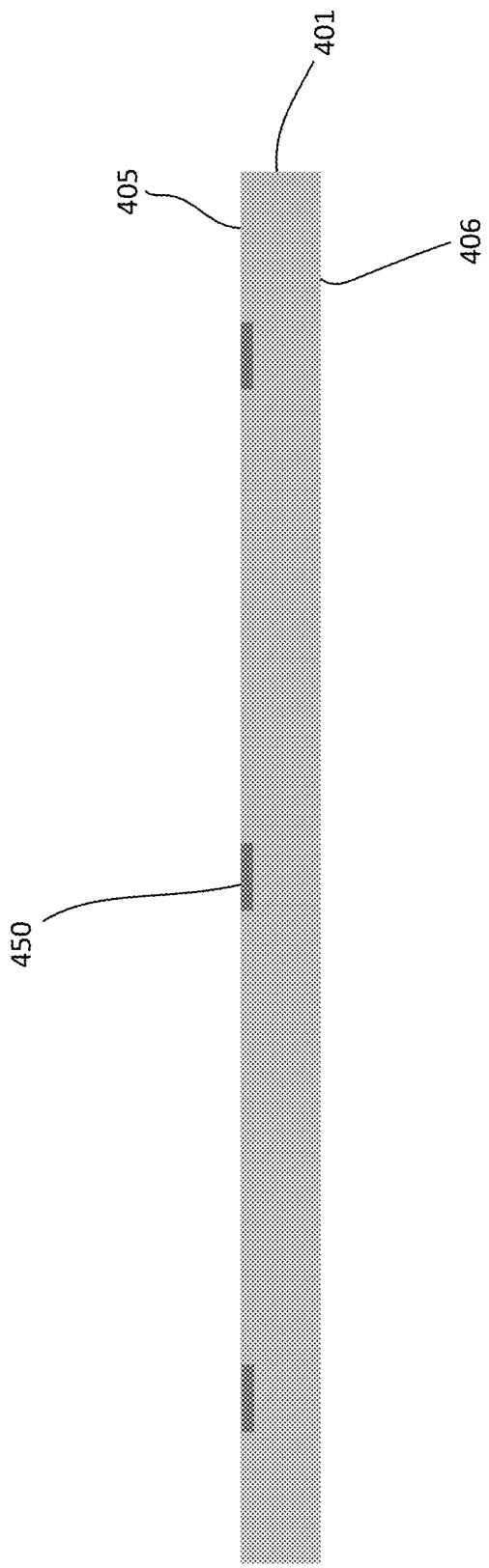

Referring to FIG. 4c, local die alignment marks 450 are formed on the alignment panel 404. The local die alignment marks 450 may be formed based on a CAD design file for the alignment panel. In one embodiment, the local die alignment marks 450 are formed by laser drilling. Other techniques for forming the local die alignment marks 450 may also be useful. For example, mechanical drilling, etching or other material removal processes may be used to form the local die alignment marks 450. In a preferred embodiment, the local die alignment marks 450 are formed using a high precision system to ensure accurate hole-to-hole pitching. The hole-to-hole pitch depends on, for example, the die size and layout of the alignment panel 404. Preferably, the local die alignment marks 450 are shallow to facilitate recycling by, for example, grinding to remove them. The local die alignment marks 450 may be about 25 um deep. Other depths for the local die alignment marks 450 may also be useful.

Figure 4D:
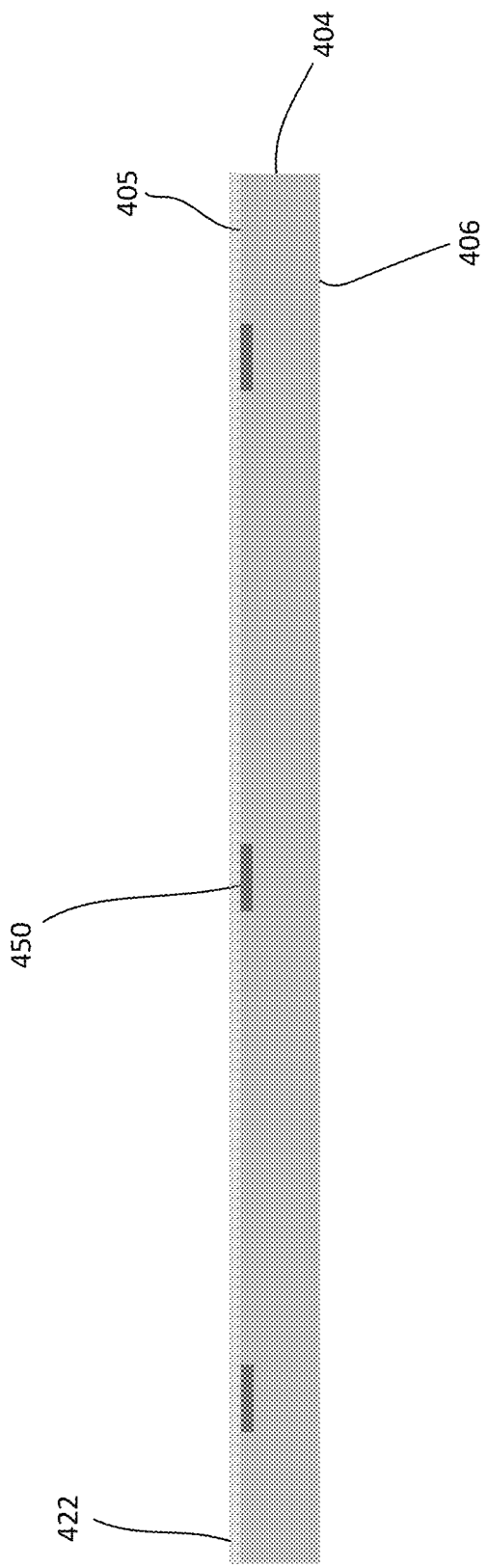

As shown in FIG. 4d, an adhesive tape 422 is applied on the active surface 405 of the alignment panel 404. The adhesive tape 422, for example, may be referred to as the panel tape. The panel tape 422 is applied on the active surface 405 of the alignment panel 405 in preparation for die bonding. For example, the panel tape 422 covers the active surface 405. The panel tape 422, in one embodiment, is a heat-sensitive or thermal release tape. Other types of panel tapes may also be used to facilitate die bonding. The panel tape 422 should be sufficiently transparent to enable cameras of a bonding tool to detect the local die alignment marks 450. For example, the panel tape 422 may be transparent or semi-transparent to enable the light of the cameras to penetrate through the panel tape 422 to detect the local die alignment marks 450. In addition, the stickiness of the panel tape 422 should be strong enough to hold the dies in position once aligned and placed thereon by a bonding tool. After applying the panel tape 422, the alignment carrier 404 is ready for die bonding.

Figure 5A:
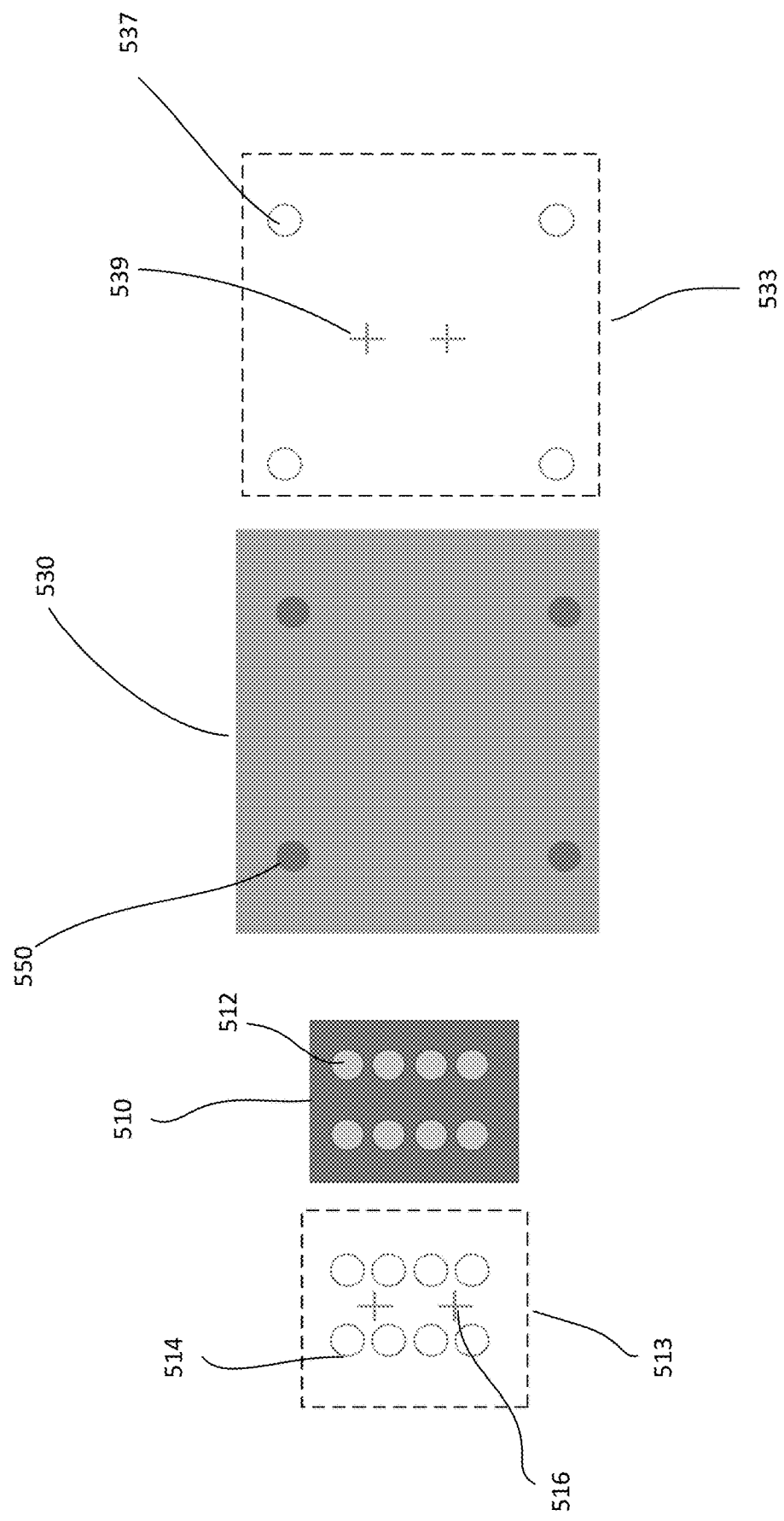

FIGS. 5a-5b illustrate an embodiment of matching patterns of AutoCAD (CAD) files to the die and alignment panel. Referring to FIG. 5a, an image of the die 510 and an image of the die bonding region 530 of the alignment panel, as captured by, for example, an alignment module of a bonding tool, are shown.

Regarding the die 510, the active surface includes die features 512. The die features 512 of the active surface of the die 510 may be via openings in the buffer layer. A corresponding CAD die file 513 of the die is shown. The CAD die file 513, for example, contains information related to the die 510. For example, the CAD die file 513 includes CAD die features 514 corresponding to the die features 512 on the die 510. The information contained in the CAD die file is based on green data. Green data, for example, refers to the as-design data. In one embodiment, the CAD die file includes coordinate locations of the die features. The coordinate positions of the die features may be center points of the die features. For example, the file may be a text file which includes coordinate positions corresponding to the center of the die features.

In some cases, there may be different files containing die feature information. For example, there may be a design file which contains the shapes of features and a coordinate file which contains the coordinates of the die features within the die. The coordinate file, for example, is a text file containing coordinates corresponding to center points of the die features The coordinate file may be referred to as the CAD die file.

In one embodiment, a CAD die reference point 516 is defined. Preferably, at least 2 CAD die reference points 516 are defined. As shown, the CAD die reference point 516 includes 2 die reference points. For example, the first and second CAD die reference points are vertically aligned. Other arrangements or numbers of CAD die reference points may also be useful. The CAD die reference points 516 are used for alignment purposes. By using 2 or more CAD die reference points 516, translational and angular (rotational) alignment can be achieved. The positions of the CAD die reference points 516 can be arbitrarily selected by, for example, the designer of the die 510. The positions of the CAD die reference points 516 can be identified based on their relative positions to the CAD die features 514, including the outline or corners of the die.

As for the die bonding region 530, it includes local die alignment marks 550. A corresponding CAD panel file 533 of the die bonding region 530 on the alignment panel is shown. The CAD panel file 533, for example, is the CAD file for the panel target, which is the die bonding region 530. The CAD panel file 533, for example, contains information related to the die bonding region 530. The CAD panel file 533 includes CAD panel features 537. The CAD panel features 537 are positioned within the CAD die bonding region which corresponds to the positions of the local die alignment marks 550 of the die bonding region 530.

Similarly, there may be different files containing panel feature information. For example, there may be a design file which contains the shapes of features and a coordinate file which contains the coordinates of the panel features within the die bond region. The coordinate file, for example, is a text file containing coordinates corresponding to center points of the panel features, such as the local alignment marks 550. The coordinate file may be referred to as the CAD panel file.

In one embodiment, a CAD panel reference point 539 is defined. Preferably, at least 2 CAD panel reference points 539 are defined. The CAD panel reference points 539 are used for alignment purposes. As shown, the CAD panel file includes 2 CAD panel reference points 539. By using 2 or more CAD panel reference points 516, translational and angular (rotational) alignment can be achieved. The positions of the CAD panel reference points 539, in one embodiment, are selected to correspond to the positions of the CAD die reference points for die bonding alignment. The positions of the CAD panel reference points 539 can be identified based on their relative positions to the CAD panel features 537.

In FIG. 5b, the CAD die file 513 is best fitted onto the die 510. For example, the CAD die features 514 are best fitted to the die features 512 of the die 510. This results in the die 510 having virtual die reference points 516 positioned on the die 510 based on the CAD die file 513. Similarly, the CAD panel file 533 is best fitted onto the die bonding region 530 on the alignment panel. For example, the CAD panel features 537 are best fitted to the local die alignment marks 550 on the alignment panel. This results in die bonding region 530 having virtual panel reference points 539. The virtual panel reference points 539 are positioned on the die bonding region 530 of the alignment panel based on the CAD panel file 533. The die 510 is aligned to the die bonding region 530 when the virtual die reference points 516 are aligned with the virtual panel reference points 539.

Figure 5C:
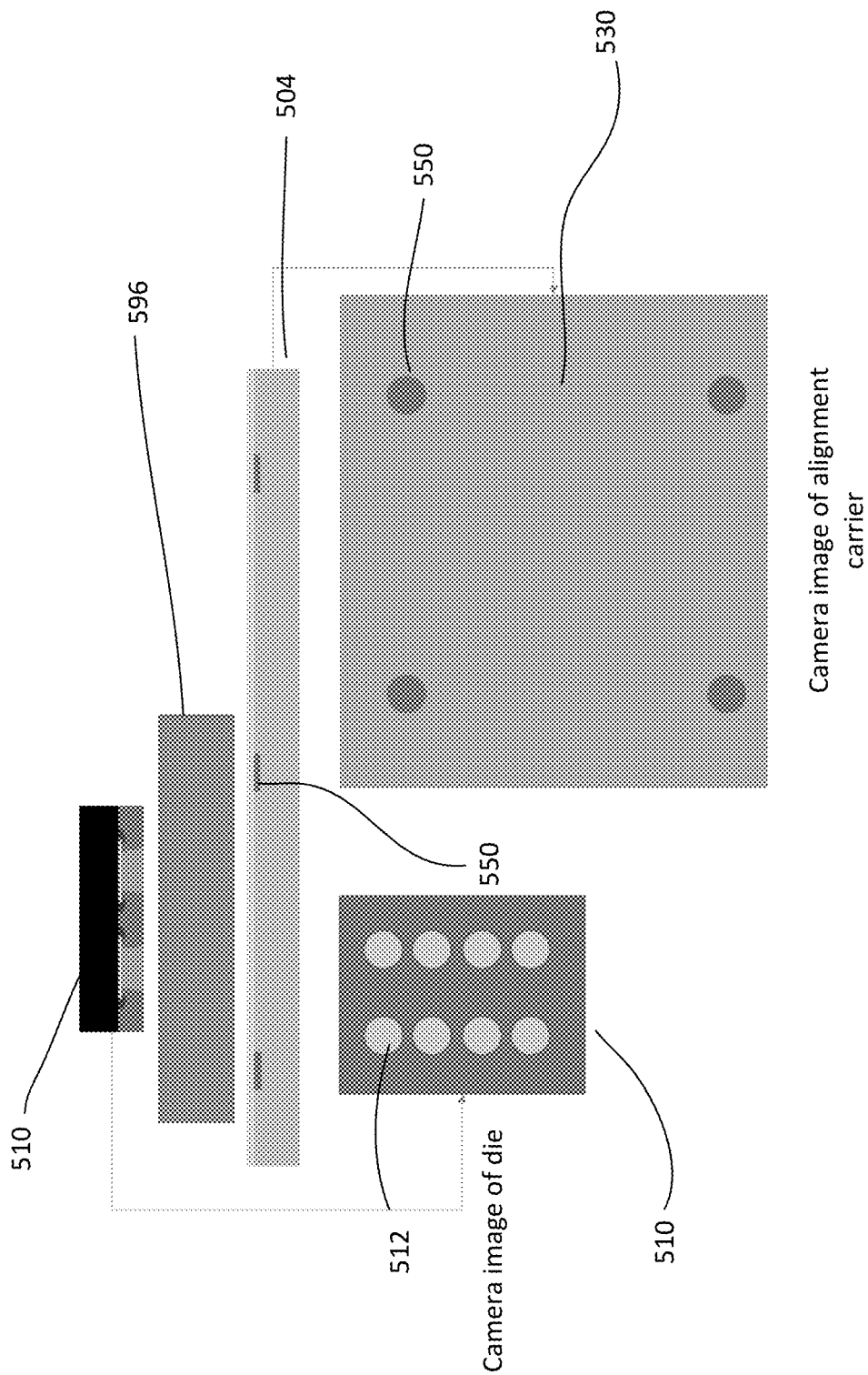
FIG. 5c is a simplified illustration of an embodiment of aligning the die to the alignment panel for bonding.

FIG. 5c shows a simplified diagram of a die bonder aligning the die for bonding onto the alignment carrier. As shown, the alignment carrier 504 is mounted onto a table of the die bonder (not shown). The bond head of the die bonder (not shown) picks up the die for bonding onto the alignment carrier 504. A camera 596 of the die bonder extends into position for aligning the die 510 to the alignment carrier. The camera 596, in one embodiment, is a collinear look-up and look-down camera. For example, the camera 596 looks up and images the active surface of the die 510 and looks down and images the alignment carrier 504 with the same line of sight. The camera image of the die and alignment carrier is shown. For example, the camera image of the die 510 shows the die features 510 and the camera image of the alignment carrier shows the die bonding region 530 with the local die alignment marks 530.

The die bonder includes memory which stores the CAD die file and CAD panel file. The CAD die file is best fitted to the image of the die 510 and the CAD panel file is best fitted to the die bonding region 530 of the alignment panel (as shown in FIG. 5b). In one embodiment, the bond head of the die bonder positions the die over the alignment panel such that the CAD die reference points are aligned to the CAD panel reference points, indicating that the die 510 is aligned to the die bonding region 530 on the alignment panel 504. When the die 520 is aligned to the die bonding region 530, the camera 596 retracts, enabling the die head to move vertically downwards to bond the die 510 to the die bonding region 530.

In one embodiment, one block of the alignment panel 504 is bonded with dies to the die bonding regions one die at a time. For example, a first die is bonded to a first die bonding region of the block of the alignment panel 504. The first die and first die bonding region may be referred to as the selected die and selected die bonding region. Bonding the selected die includes the die bonder picking up the selected die, aligns the selected die to the selected die bonding region and bonding the selected die to the selected bonding region. After the selected die is bonded to the selected die bonding region, the die bonder determines if there are other die bonding regions of the block which need processing. If there are, the die bonder picks up a next selected die to bond to a next selected die bonding region of the block. The next selected die and the next selected die bonding region becomes the selected die and selected die bonding region. The process of bonding the selected die to the selected die bonding region repeats until all die bonding regions of the block are processed. After processing of the block is completed, the die bonder determines if there are other blocks of the alignment panel 504 which need processing. If there are, the die bonder processes the remaining blocks until all blocks of the alignment panel 504 are processed.

As described, the alignment panel includes local alignment marks which are formed in predefined locations thereon with high precision. The local alignment marks and die features, such as via openings, are used as fiducials and mated to respective CAD files (CAD die and CAD panel files) for referencing of the die and the alignment panel. The bonder, with the look-up and look-down camera, aligns the die to the alignment panel with the same line of sight. The various features enable precision bonding of the dies to the alignment panel with high throughput and high placement accuracy of 3 um, XY repeatability of +/−0.5 um and theta repeatability of +/−004°. Furthermore, pre-bond and post-bond inspections can easily be performed. In addition, the high accuracy and high throughput increase output as well as simplifying downstream processing of the reconstructed wafer, resulting in lower manufacturing costs and higher yields.

Figure 6A:
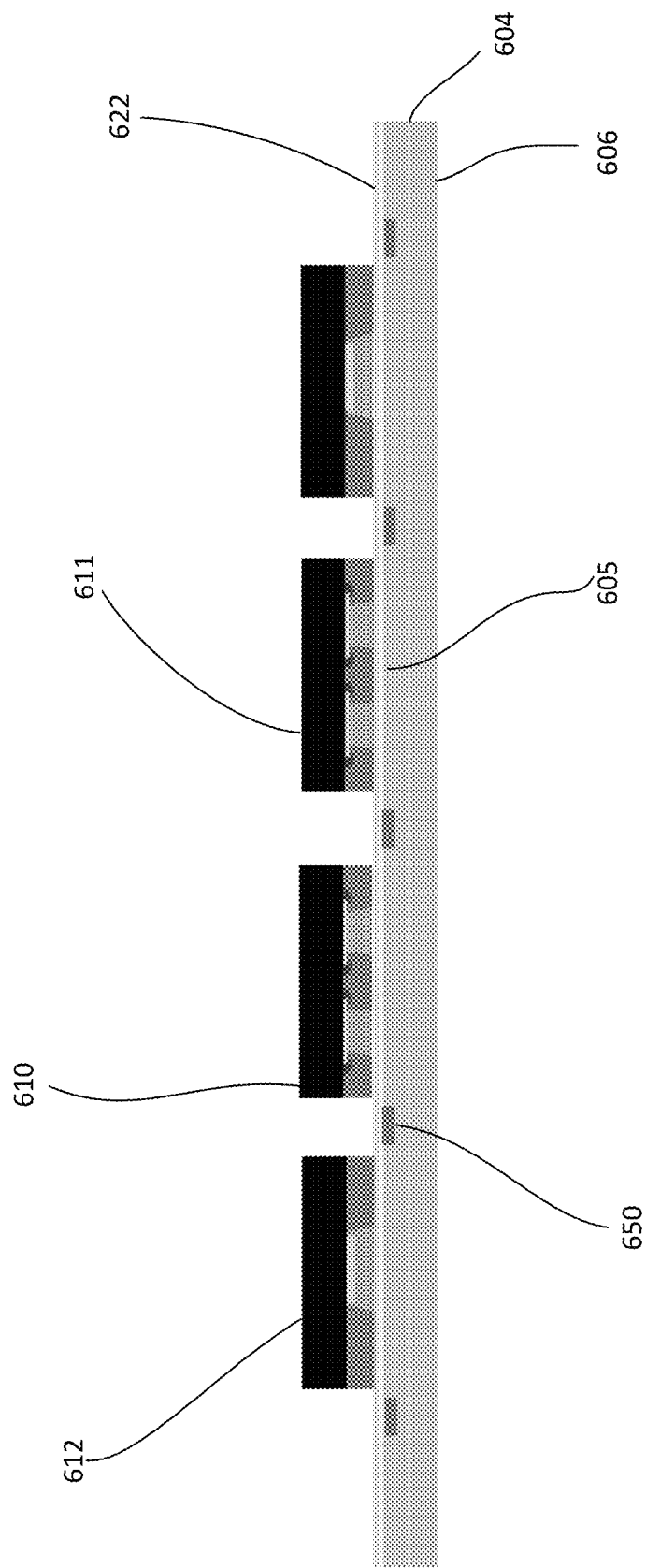
FIGS. 6a-6e are simplified cross-sectional views illustrating an embodiment of a process for forming a reconstructed wafer and preparing the reconstructed wafer for further processing.

FIGS. 6a-6e are simplified cross-sectional views depicting an embodiment of a process for forming a reconstructed wafer and preparing the reconstructed wafer for further processing. Referring to FIG. 6a, the alignment panel 604 includes the panel bonding surface 605 and panel non-bonding surface 606. The panel bonding surface includes local die alignment marks 650 for die bonding regions thereon. The panel adhesive tape 622 is applied to the panel bonding surface 605. The dies 610 are bonded to the die bonding regions of the alignment panel 604 by a die bonder. The die bonder aligns and bonds the dies 610 to the die bonding regions using the local alignment marks 650, as previously described. The panel tape attaches the dies to the die bonding regions of the alignment panel 604.

As shown, the alignment panel 604 includes one block of dies 610. The dies 610 include alignment dies 612 and lives dies 611. The alignment dies 612, for example, may be located at the corner die bonding regions of the block. As such, the simplified cross-sectional view illustrates either the first row, last row, first column or last column of dies 610 of the block.

Figure 6B:
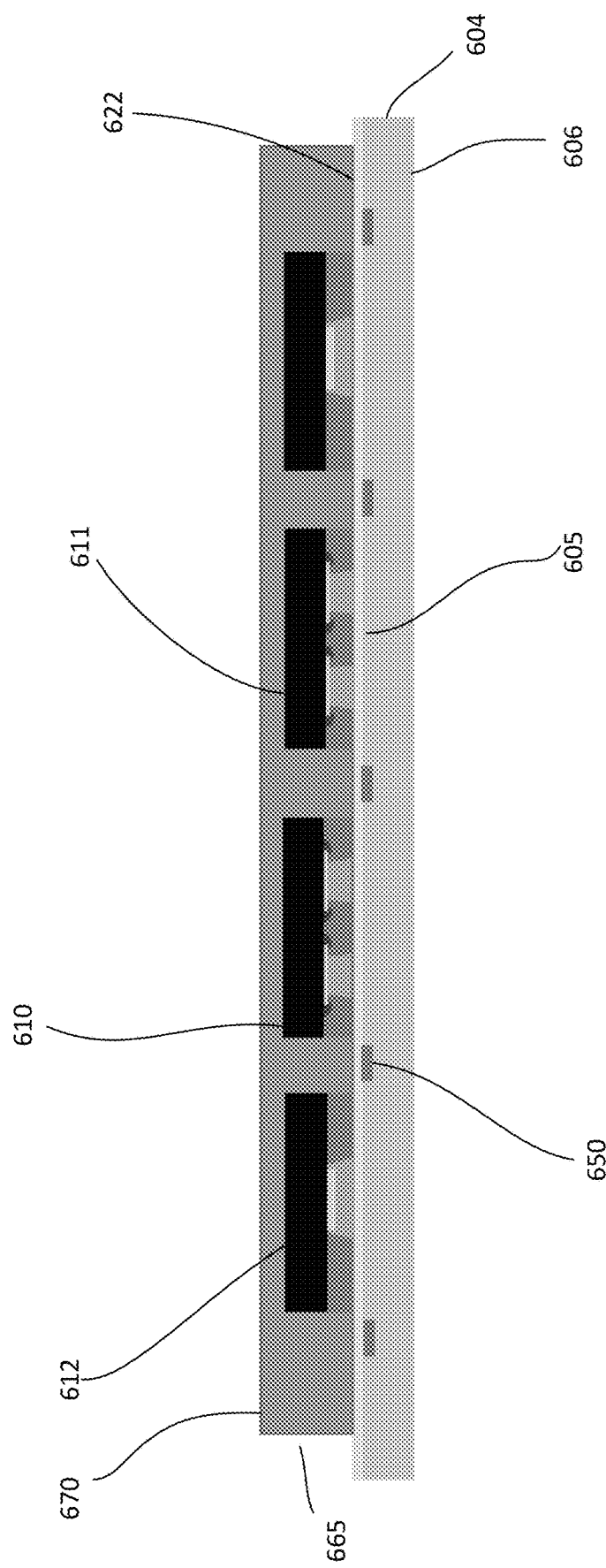

Referring to FIG. 6b, the alignment panel bonded with the dies 610 is subjected to a molding process. For example, a mold compound 670 is formed over the alignment panel 604, covering it and the dies. The mold compound 670 and the dies 610 may be referred to as a mold panel or reconstructed wafer 665 while the mold panel 665 and the alignment panel 604 may be referred to as a panel assembly or reconstructed wafer assembly. The mold compound 670 may be in the form of powder/granules, liquid or film. In one embodiment, compression molding is performed to form the mold compound 670. Other techniques for forming the mold compound 670 may also be useful. The molding process is a high-temperature process. For example, the alignment panel 604 with the dies 610 is subjected to high temperatures and pressure, such as about 150-180° C. and 240-320TF. The material of the alignment carrier 604 can sustain conditions of the molding process without distortion, warpage or damage. In addition, due to the low CTE material of the alignment carrier 604, minimum linear variations due to temperature changes occur.

Figure 6C:
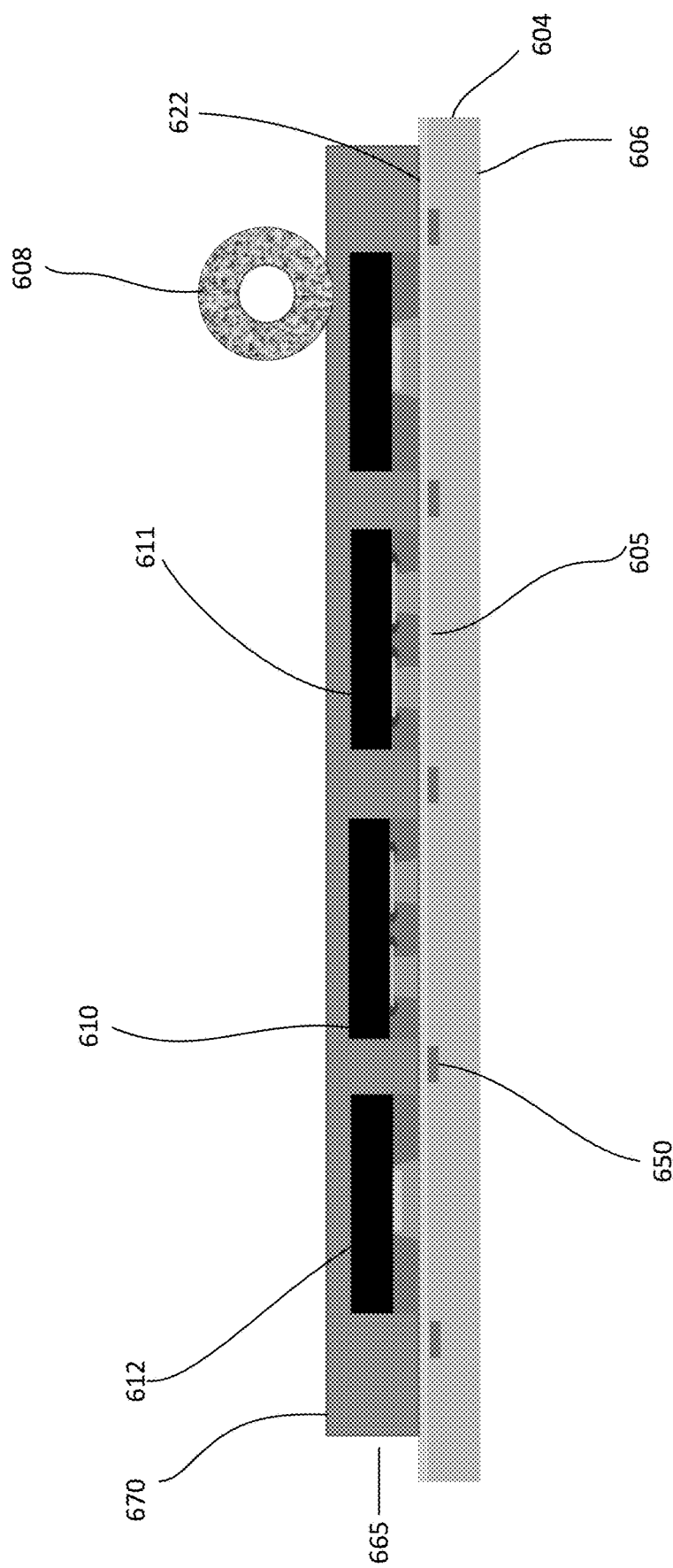

As shown in FIG. 6c, the top surface of the mold compound 670 of reconstructed wafer 665 is ground using, for example, a grinder 608. The grinder, for example, includes a grinding wheel for grinding the top surface of the mold compound 670. The surface of the mold compound 670 may be ground to result in the reconstructed wafer 665 having a desired or defined height as well as ensuring a uniform thickness to relieve stress.

Figure 6D:
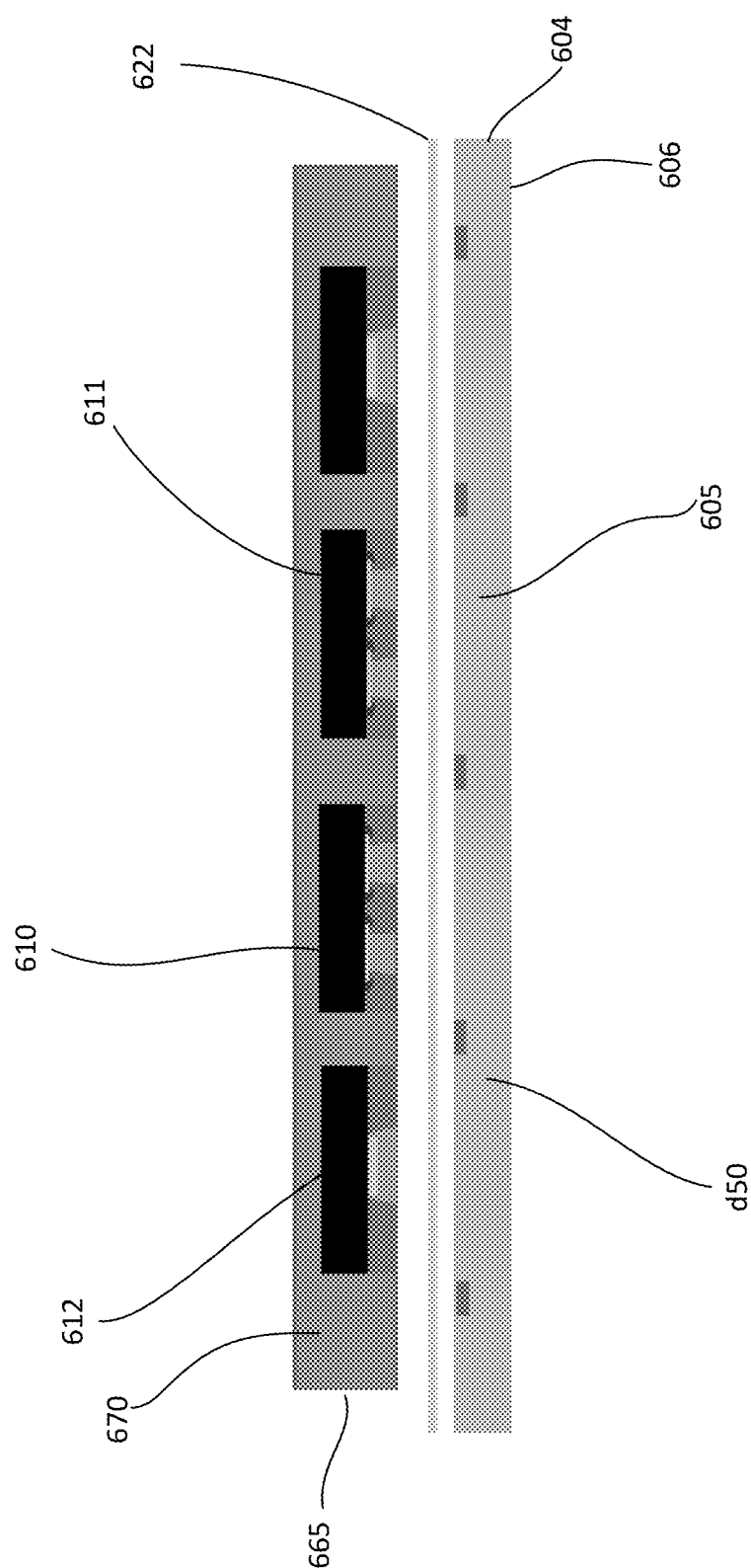

Referring to FIG. 6d, the reconstructed wafer 665 is released from the alignment panel 604. In one embodiment, releasing the reconstructed wafer 665 from the alignment panel 604 includes subjecting the reconstructed wafer assembly to a high-temperature process, such as about 210°

C. The high-temperature release process causes the panel tape 622 to lose its adhesive property, enabling the reconstructed wafer 665 to be separated from the adhesive tape 622 and alignment panel 604. For example, the release process may include releasing the panel tape 622 from the alignment panel 604, followed by peeling the panel tape 622 off of the reconstructed wafer 665. Alternatively, the release process may release the reconstructed wafer 665 from the panel tape 622, followed by peeling the panel tape 622 off of the alignment panel. Other techniques for releasing the reconstructed wafer 665 from the reconstructed wafer assembly may also be useful.

Figure 6E:
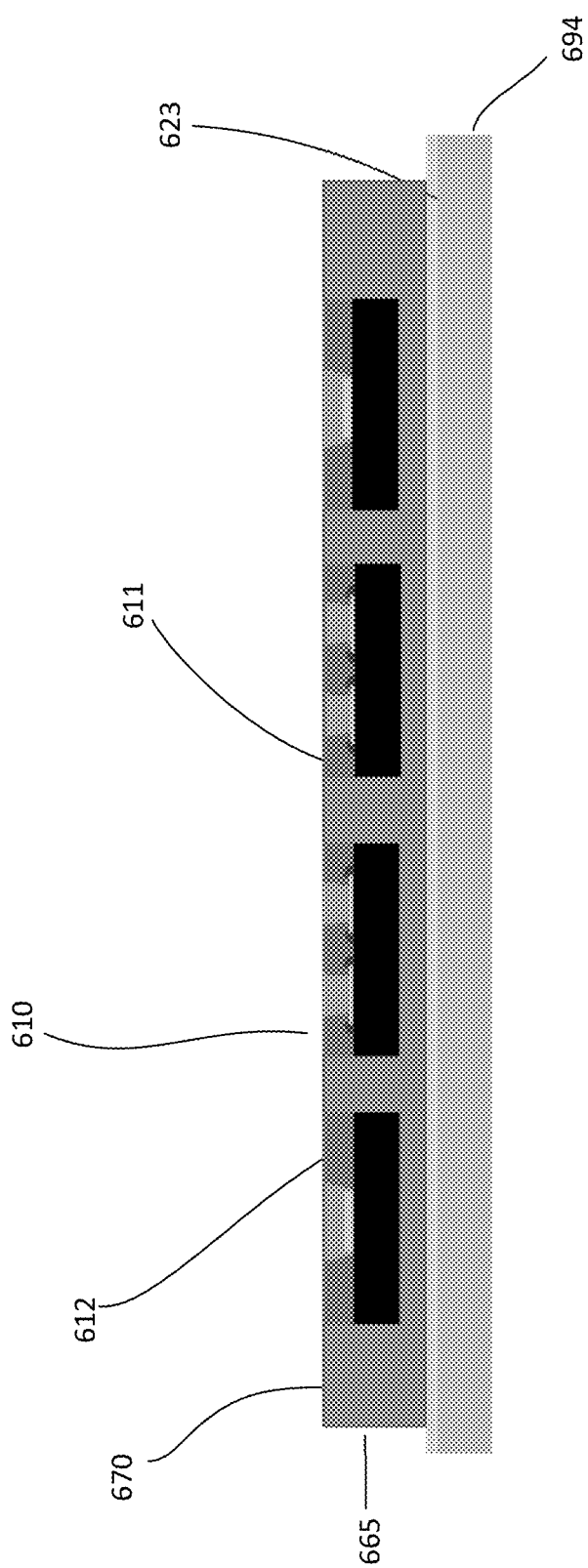

In one embodiment, the released reconstructed wafer 665 is mounted onto a carrier substrate 694, as shown in FIG. 6e. The carrier substrate 694 serves as a substrate for downstream processing of the reconstructed wafer 665. For example, the carrier substrate should be sufficiently rigid to support the reconstructed wafer 665 for downstream processing, such as forming interconnects or conductive traces on the reconstructed wafer 665, The carrier substrate 694 may be formed of a metal. The carrier substrate, for example, may be similar to the alignment panel except that no local die alignment marks are needed. Other types of materials may also be used to form the carrier substrate 694.

A carrier tape 623 is applied to a surface, such as the top surface, thereof. The carrier tape, for example, may be a heat-sensitive or thermal release tape. Other types of tapes may also be used to facilitate bonding the reconstructed wafer 665 to the carrier substrate 694. The reconstructed wafer is attached to the carrier substrate 694 using the carrier tape 623. In one embodiment, the active surface of the reconstructed wafer 665 is exposed (face-up). For example, the inactive surface of the reconstructed wafer 665 is bonded to the carrier substrate 694. The carrier substrate 694 with the reconstructed wafer 665 may be referred to as carrier reconstructed wafer assembly.

Figure 7A:
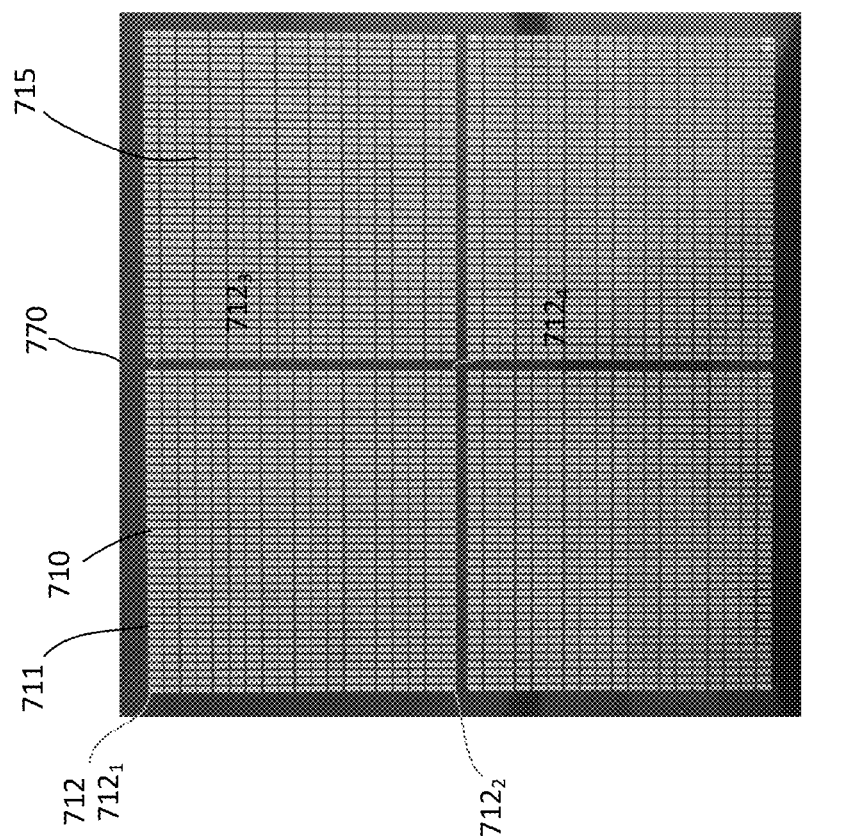
FIGS. 7a-7c show images depicting an embodiment of a die location check (DLC) process on the reconstructed wafer.
Figure 7B:
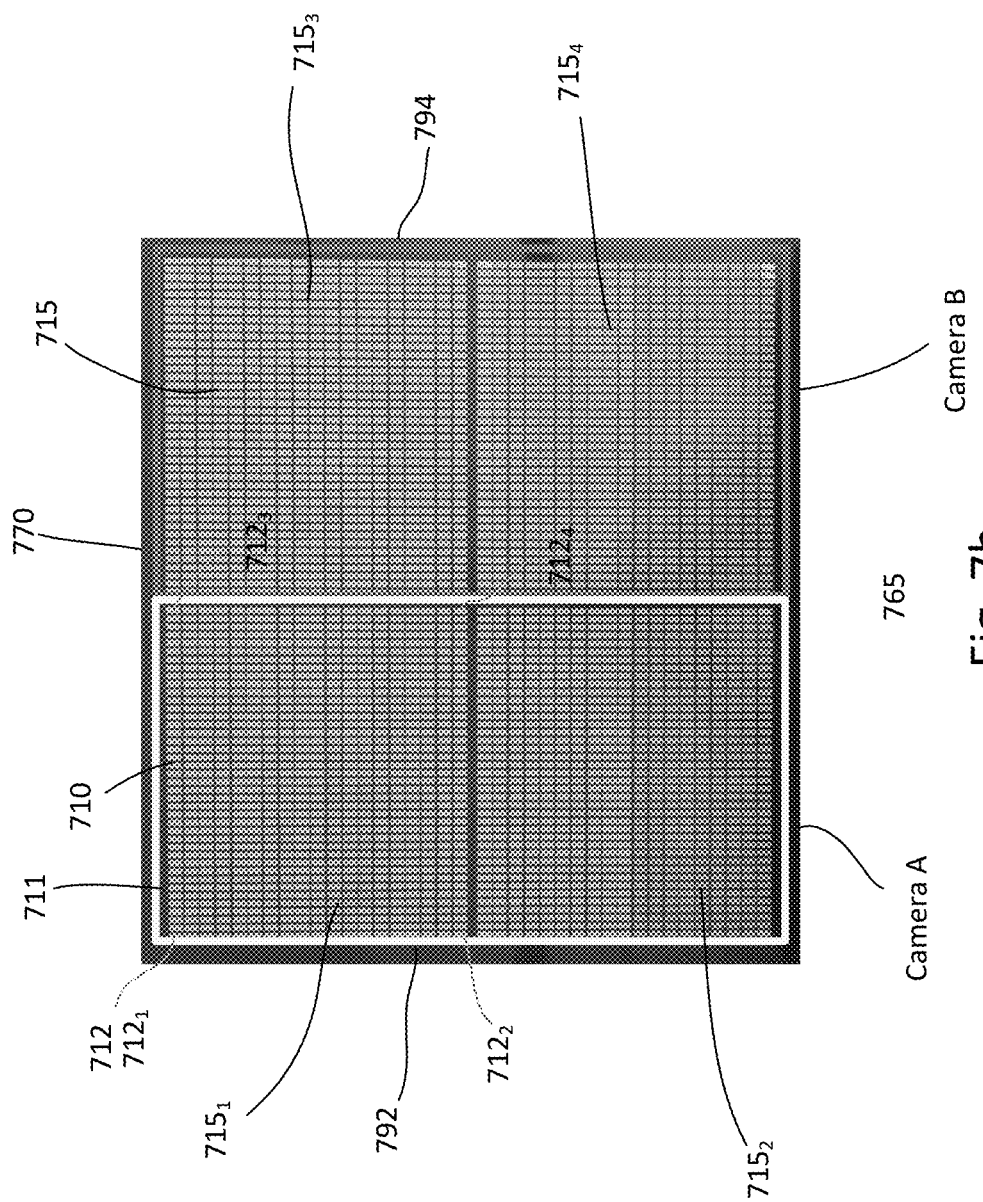
Figure 7C:
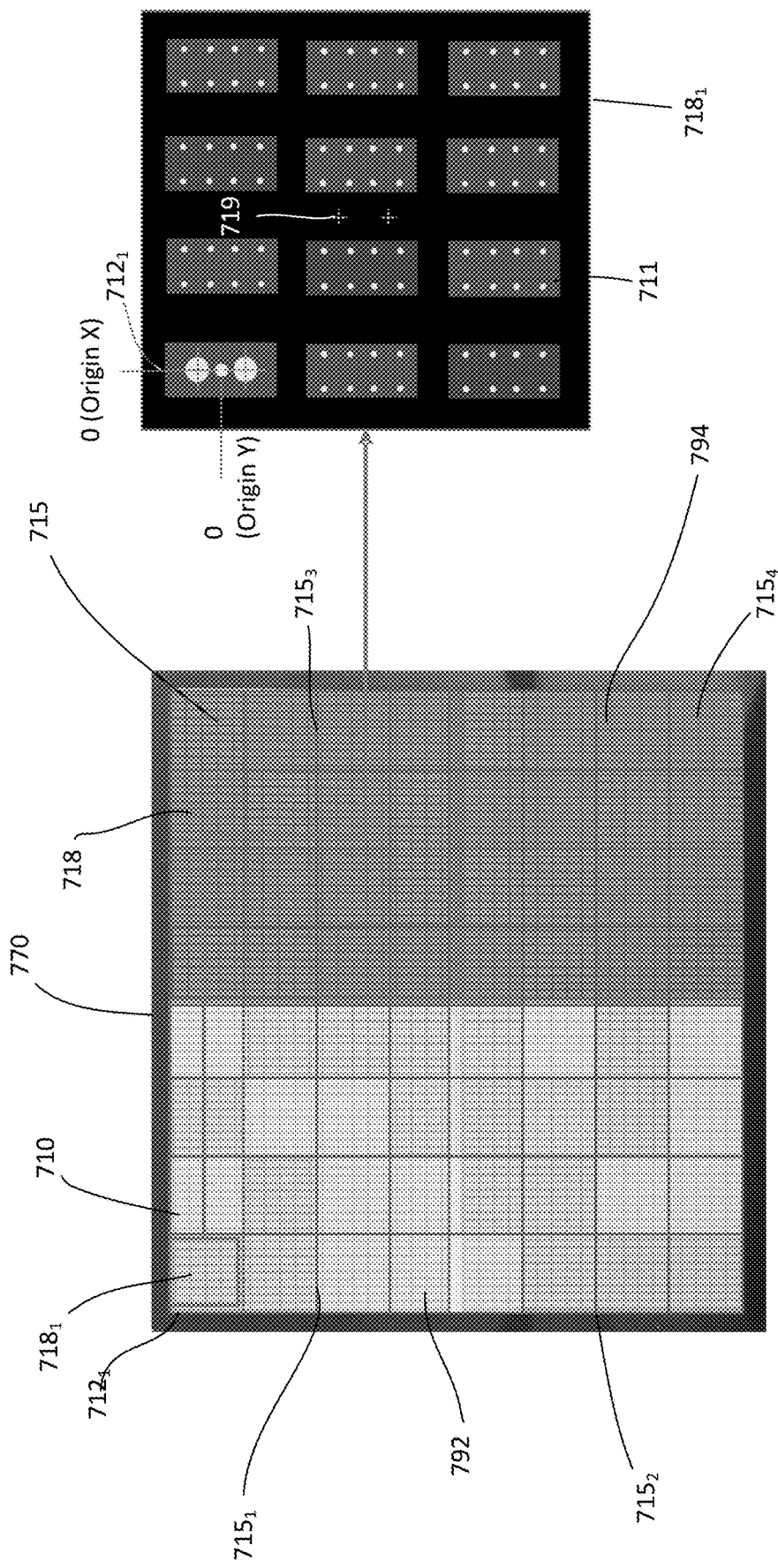

FIG. 7a-7c depict an embodiment of a die location check (DLC) process on a reconstructed wafer. Referring to FIG. 7a, a carrier reconstructed wafer assembly is shown. The carrier reconstructed wafer assembly includes the reconstructed wafer 765 mounted face-up on a carrier substrate (not visible). The reconstructed wafer includes dies 710 with the mold compound 770. The active surfaces of the dies 710 are visible. As shown, the dies 710 of the reconstructed wafer 765 are arranged in 4 blocks 715. The blocks are arranged in a 2×2 block matrix arrangement. The dies 710 of each block 715 includes alignment dies 712 and live dies 711. The alignment dies 712 may be used for alignment purposes only or may be live dies used for alignment purposes. Each block 715 may include 4 alignment dies $712_{1-4}$. In one embodiment, the alignment dies $712_{1-4}$ are located at the corners of the blocks 715. Other arrangements of the alignment dies 712 may also be useful.

Referring to FIG. 7b, the DLC process scans the reconstructed wafer 765. In one embodiment, the DLC employs multiple cameras to scan the reconstructed wafer 765. In one embodiment, the DLC scan employs first and second cameras (camera A and camera B) to scan the reconstructed wafer. As shown, camera A scans a first camera area 792 of the reconstructed wafer 765 (left half); camera B scans a second camera area 794 of the reconstructed wafer 765 (right half). For example, camera A scans the entirety of the first and second blocks $715_{1-2}$ on the left half of the reconstructed wafer 765 and camera B scans the entirety of the third and fourth blocks $715_{1-2}$ on the right half of the reconstructed wafer 765.

The DLC scan identifies alignment dies 712 of each block to determine the zero or origin point (0, 0) on a cartesian coordinate system. In one embodiment, the zero point is the alignment die $712_1$ located at the top left corner of the block 715. For example, the alignment die $712_1$ at the top left corner of each block 715 provides the zero point. Providing the zero point at other positions of the block 715 may also be useful. Preferably, the zero point of each block is positioned at the same location. Positioning the zero or origin points of different blocks at different locations may also be useful.

In one embodiment, the zero point is based on a point on the alignment die $712_1$. The zero point may correspond to, for example, a center point of the alignment die $712_1$. For example, the scan can determine the corners of the alignment die $712_1$ and a center of the corners may be the zero point. Providing the zero point corresponding to other positions or features of the alignment die $712_1$ may also be useful.

As shown in FIG. 7c, the DLC scan scans the entirety of each block 715 of the reconstructed wafer 765. For example, each camera scans the blocks 715 in its respective camera area one block 715 at a time, in the case that the camera area contains multiple blocks 715. Within each block 715, camera images multiple dies at a time. For example, each camera images one sub-block 718 of dies 710 of the block 715 one sub-block 718 at a time. The scan pattern for the block 715, for example, may be from left to right and top to bottom. Other scan patterns for scanning the block may also be useful. The scan produces a complete image of each block.

The image size for the sub-blocks 718, for example, may be about 14×10 mm. An image showing a sub-block $718_1$ is provided. The image shows the sub-block $718_1$ in greater detail. Illustratively, the sub-block $718_1$ includes 12 dies 710 arranged in a 3×4 matrix. Other image sizes for the sub-blocks 718 may also be useful. For example, the image size may be selected to accommodate other numbers of dies 710. The sub-block $718_1$ includes the origin alignment die $712_1$ located at the upper left corner of the sub-block $715_1$. For example, the sub-block $718_1$ is the first sub-block of the first block $715_1$.

As shown, the alignment die $712_1$ is different from the live dies 711. For example, the alignment die features are different from the live die features. As shown, the alignment die $712_1$ includes 2 large alignment die features (large vias) with a smaller alignment die feature (smaller via) therebetween arranged in a line. Other arrangements of the alignment die features may also be useful. As for the live dies 711, they each include 2 columns of live die features (vias). The vias of the live dies are smaller than the vias of the alignment die $712_1$. Other arrangements of the dies or die features may also be useful.

The origin alignment die $712_1$ forms the zero point of the block $715_1$. For example, the x and y coordinates of the zero point of the alignment die $712_1$ is (0, 0) of the Cartesian system corresponding the block $715_1$. In one embodiment, the zero point corresponds to a center point of the alignment die $712_1$. Providing the zero point corresponding to other positions of the alignment die $712_1$ may also be useful. For example, the zero point may be determined by using other alignment die features or an offset of the alignment die features of the alignment die $712_1$.

The sub-block $718_1$ includes a sub-block reference point 719. The sub-block reference point 719 may be defined using a CAD sub-block file, similar to the CAD die file described in FIG. 5a, except that the CAD sub-block file includes die features of the multiple dies 710 of the sub-block 718. The die features of the dies 710 are positioned in the CAD die file based on green data. For example, the pitch of the dies, size of the dies and locations of the die features are based on green data. The sub-block reference point 719, for example, is a virtual sub-block reference point of the sub-block 718₁. The location of the sub-block reference point 719 may be pre-defined in the CAD sub-block file. The location of the sub-block reference point may be based on a feature or features of one or more dies of the sub-block 718₁. The sub-block reference point, as shown, is offset from the zero point or the alignment die 712₁ located at the top left corner of the sub-block 718₁.

In one embodiment, the sub-block reference point 719 of the sub-block 718₁ includes first and second reference points. As shown, the first and second reference points are arranged in vertical alignment. For example, the second reference point is offset from the first reference point. The use of at least two sub-block reference points enables translational and angular alignment. Other arrangements for the first and second reference points may also be useful. Similar to the die reference points, the sub-block reference points are virtual sub-block reference points.

In one embodiment, a coordinate point of the sub-block (sub-block) 712₁ is defined. The sub-block coordinate point may be arbitrarily defined. For example, the sub-block coordinate point may be defined by selecting one die feature of one of the dies of the sub-block 718₁. The sub-block coordinate point may be offset from the zero point of the block 715. In some cases, the sub-block coordinate point may be one of the sub-block reference points 719 of the sub-block 718₁. In other cases, the sub-block coordinate point may be the zero point of the sub-block 718₁. In such cases, the sub-block coordinate point of sub-block 718₁ is not offset from the zero point of the block 765.

As discussed, the scan generates images of the sub-blocks 718 of the block 715. Coordinate points for the other sub-blocks 718 of the block 715 are generated with respect to the zero or origin point. Determining the coordinate points of the other sub-blocks is similar to generating the coordinate point of the first sub-block 718₁.

In one embodiment, based on the first sub-block 718₁, the zero point is determined. Based on the zero point, the positions of other sub-blocks can be determined. For example, using green data, the pitch of the other sub-blocks can be determined. The center of the top left die of each sub-block, for example, may be the sub-block coordinate point for each sub-block of the block. Selecting other positions for the sub-block coordinate point may also be useful. The sub-block coordinate points may be referred to as the index nominal coordinate points since they are determined based on green data with respect to the zero point.

In one embodiment, the CAD sub-block file is best fitted to the image of the sub-block. The best fitting is performed for each sub-block. The best fitting may result in an offset with respect to the index nominal coordinate point of each sub-block. The virtual sub-block reference points are also offset. This generates a DLC file which is a map of the block, containing sub-block coordinate points and their virtual sub-block reference points.

In one embodiment, one DLC file is generated for each block. The data contained in the DLC file may be in the DLC format. The DLC files of the blocks 715 are used, for example, to generate laser direct imaging (LDI) files for downstream LDI processing, such as forming traces on the blocks 715 of the reconstructed wafer. For example, the LDI file is readable by an LDI tool, such as a laser direct imager.

The image of the sub-block 718₁ shown in FIG. 3c is the first sub-block of the first block 715₁. In particular, the first sub-block 718₁ includes the alignment die 712₁ which is the zero point of the first block 715₁. Other sub-blocks of the block may have different arrangements. For example, the alignment die 712 may be located at different positions of the sub-block or that the sub-block may include no alignment die.

Figure 7D:
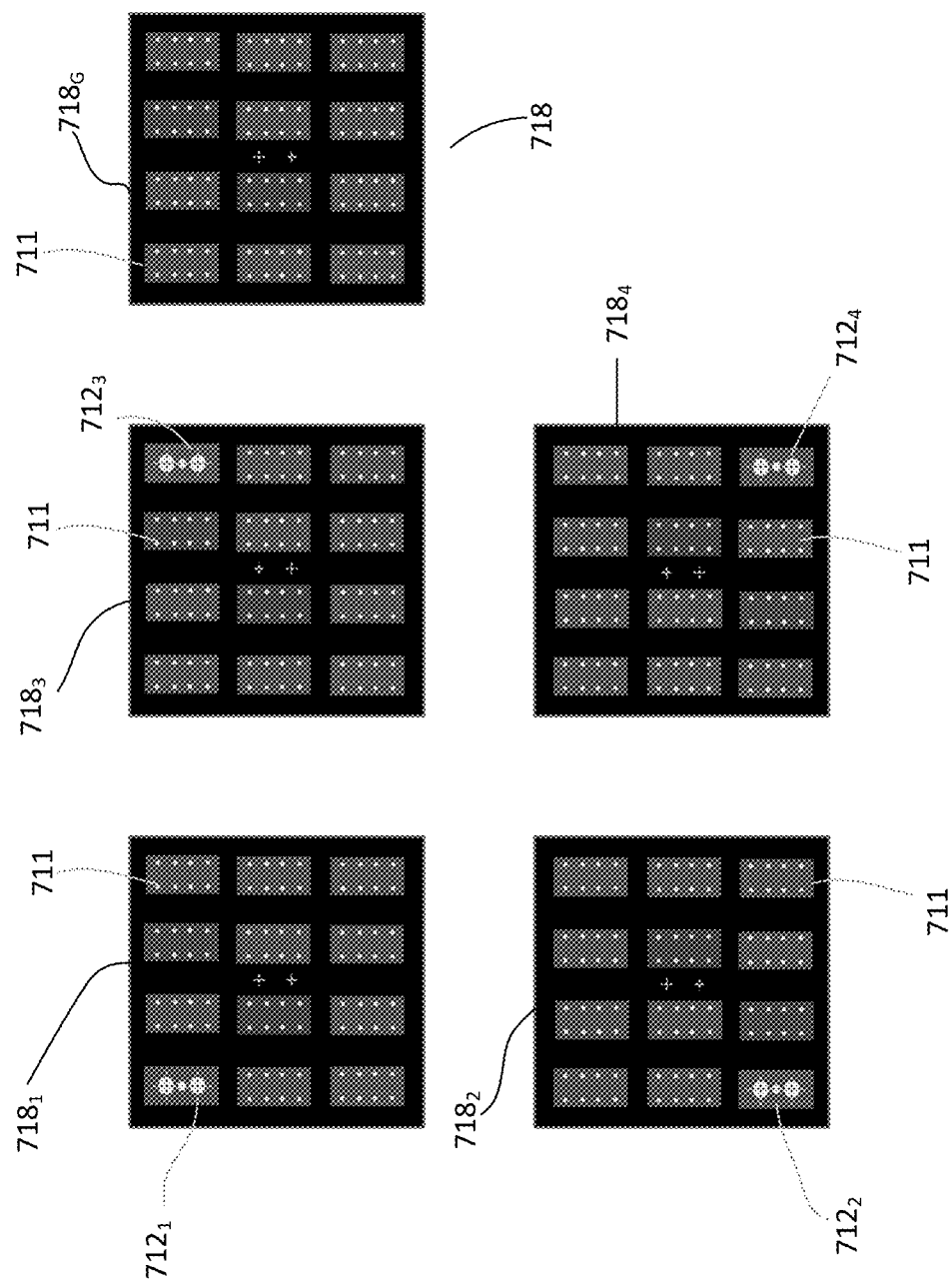
FIG. 7d show images of different arrangements of the sub-blocks.

FIG. 7d shows images of different arrangements of sub-blocks 718 of the block. As shown, each arrangement of the sub-blocks 718 is a 3×4 matrix. Images of a general sub-block 718_G and first, second, third and fourth corner sub-blocks 718₁₋₄ are shown. The first corner sub-block 718₁ includes the first alignment die 712₁ disposed on the top left corner of the sub-block and the live 711 dies are disposed at other positions of the sub-block. The second corner sub-block 718₂ includes the second alignment die 712₂ disposed on the bottom left corner of the sub-block matrix and the live dies 711 are disposed at other positions of the sub-block. The third corner sub-block 718₃ includes the third alignment die 712₃ disposed on the top right corner of the sub-block matrix and the live dies 711 are disposed at other positions of the sub-block. The fourth corner sub-block 718₄ includes the fourth alignment die 712₄ disposed on the bottom right corner of the sub-block matrix and the live dies 711 are disposed at other positions of the sub-block. As for the general sub-block 718_G, it does not include any alignment dies, only the live dies 711.

One of the alignment dies of the corner sub-blocks 718₁₋₄ is selected as the zero point of the block. For example, the first alignment die 712₁ of the first corner sub-block 718₁ may be selected as the zero point of the block. Coordinate points of the other sub-blocks 718 are with respect to the zero point.

As described in FIG. 7d, the block includes alignment dies 712 at the corners of the block. However, other arrangements of alignment dies for the block may also be useful. In such cases, the arrangement of the dies of the sub-blocks 718 may vary from that described in FIG. 7d, based on the arrangement of the alignment dies 712 of the block.

Figure 8A:
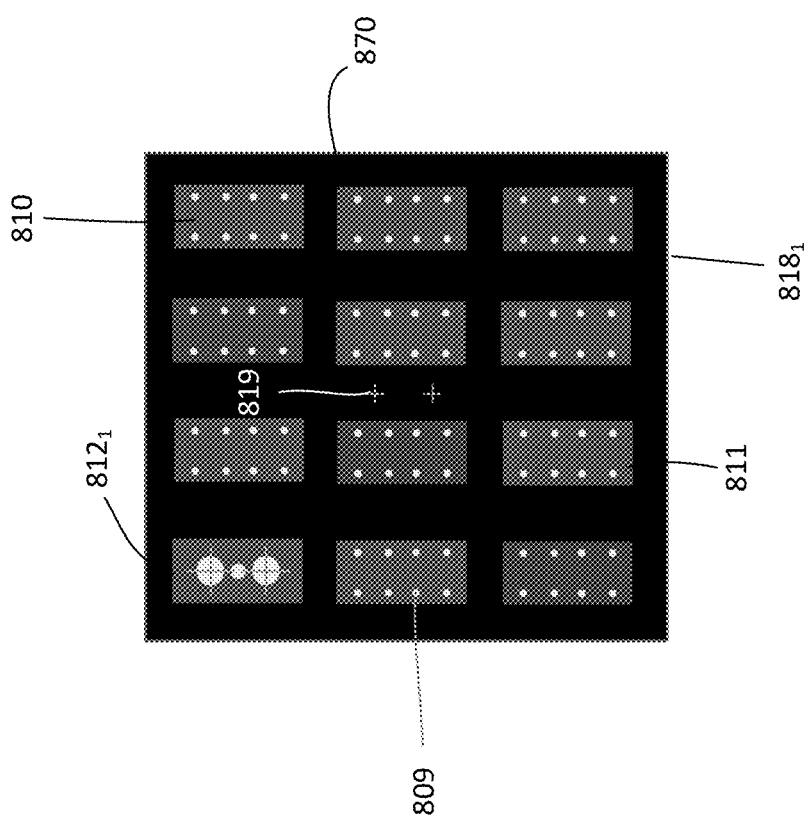
FIGS. 8a-8c show an embodiment for generating a laser direct imaging file for forming traces on the reconstructed wafer.
Figure 8B:
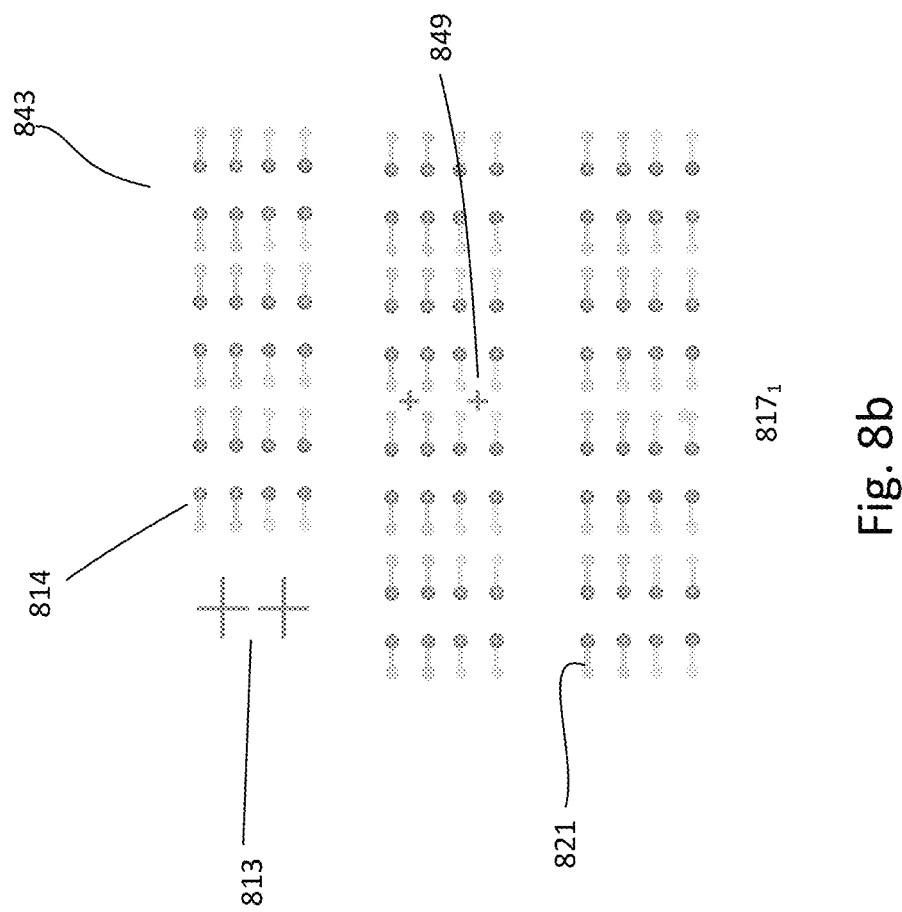
Figure 8C:
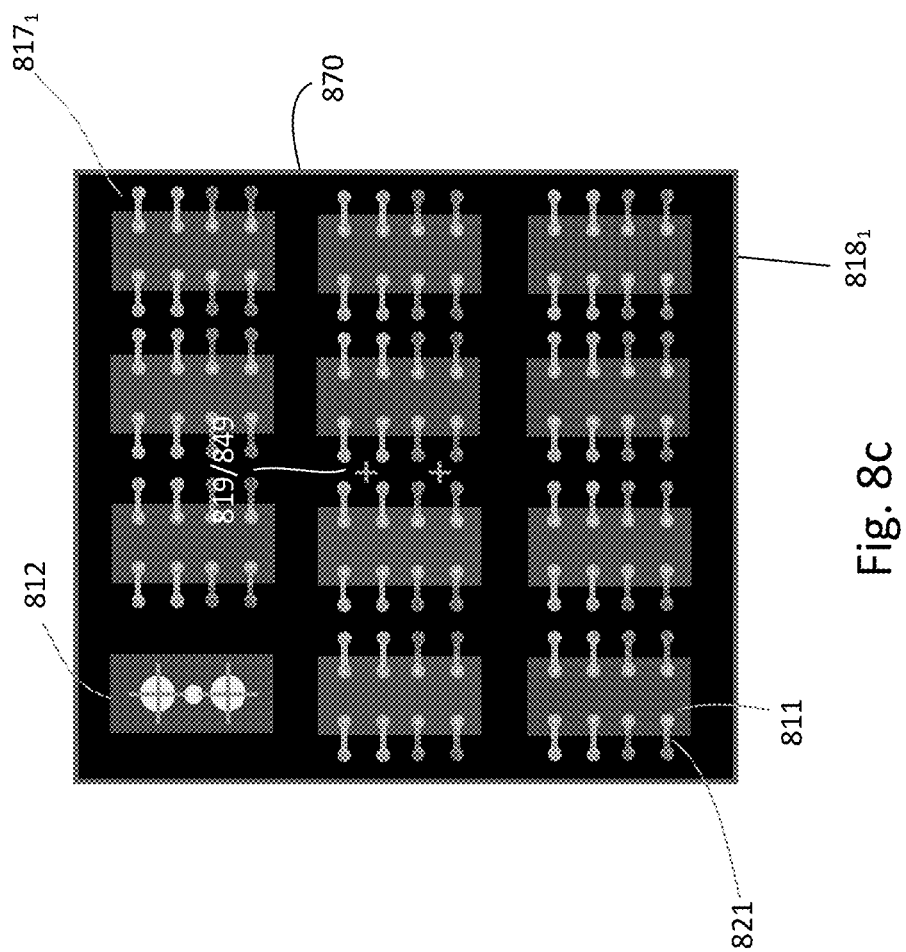

FIGS. 8a-8c show an embodiment of generating a circuit file for forming conductive traces on the reconstructed wafer. In FIG. 8a, an image of the first sub-block 818₁ of the reconstructed wafer is shown. The sub-block 818₁, for example, includes a 3×4 matrix of dies 810. Illustratively, the sub-block 818₁ includes the origin alignment die 812₁ and live dies 811. As shown, the origin alignment die 812₁ is a dedicated alignment die with features which are different from the live dies. Alternatively, the alignment die 812₁ may be a live die. As discussed, coordinate points of all sub-blocks of the block are generated with respect to the origin point and provided in a DLC file. In addition, virtual sub-block reference points 819 may be provided from a sub-block CAD file.

Referring to FIG. 8b, a circuit file 817₁ corresponding to the first sub-block of dies is shown. For example, the circuit file corresponds to the first sub-block with the origin alignment die. The circuit file includes circuits for the dies of the sub-block. The circuit file, in one embodiment, is based on green or as-designed data. For example, the placement of the circuits is based on the designed pitch and positions of the dies and die features of the sub-block.

The circuit file of the first sub-block includes a position 813 of the alignment die. As shown, no circuit pattern is provided for the alignment die. For circuit files of sub-blocks without alignment dies, there would be the circuit pattern for the die at the alignment die position. In some cases, the location of the alignment die may be at other locations of the sub-block. In such cases, no circuit is provided at the location of the alignment die. The circuits of the circuit file for the dies of the sub-block are unadapted. For example, the circuits are positioned in the circuit file according to green data. The circuit file includes a sub-block circuit reference point 849. As shown, the sub-block circuit reference point 849 includes first and second sub-block reference points. Providing other numbers of sub-block circuit reference points 849 may also be useful. The sub-block circuit reference points correspond to the sub-block reference points on the DLC file.

In FIG. 8c, an LDI file is generated. As shown, the circuit file for the first sub-block is aligned and attached to the first sub-block $818_1$. For example, the sub-block circuit reference points 849 of the first circuit sub-block file $817_1$ is aligned to the first sub-block reference points 819 of the first sub-block $818_1$ of the DLC file. The alignment and attachment of circuit files of sub-blocks are performed for all the sub-blocks of the block. For example, corresponding circuit files are aligned and attached according to the sub-block coordinate points in the DLC file. This generates the LDI file which is used in downstream processing, for example, to generate traces on the alignment carrier. The LDI file is in a format which is readable by the LDI tool.

Figure 8D:
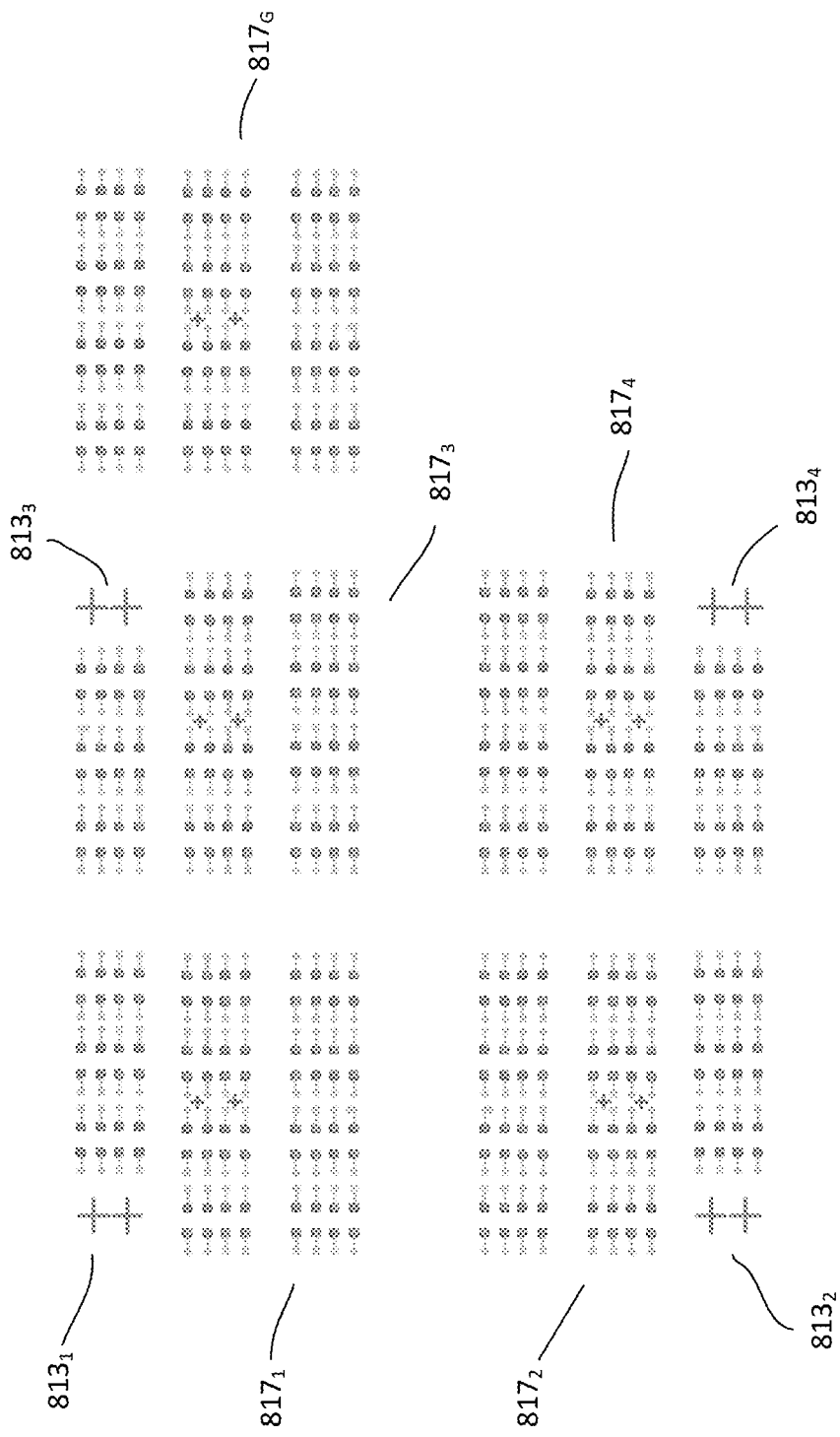
FIG. 8d show different arrangements of sub-block circuit files.

FIG. 8d shows different arrangements of the sub-block circuit files 817. As shown, the sub-block circuit files include a general sub-block circuit file $817_G$ and corner sub-block circuit files $817_{1-4}$ for the corner sub-blocks. The first corner sub-block circuit file $817_1$ includes the first alignment die position $813_1$ located at the top left corner. The second corner sub-block circuit file $817_2$ includes the second alignment die position $813_2$ located at the bottom left corner. The third corner sub-block circuit file $817_3$ includes the third alignment die position $813_3$ located at the top right corner. The fourth corner sub-block circuit file $817_4$ includes the fourth alignment die position $813_4$ located at the bottom right corner. No circuit patterns are provided for the alignment die positions of the sub-block circuit files $817_{1-4}$. As for the general sub-block circuit file $817_G$, it includes circuit patterns in all die positions.

As described in FIG. 8d, the sub-block circuit files 817 are for a block that includes alignment dies at the corners of the block. However, other arrangements of alignment dies for the block may also be useful. In such cases, the circuit arrangement of the sub-block circuit files 817 may vary from that described in FIG. 8d, based on the arrangement of the alignment dies of the block.

Figure 9A:
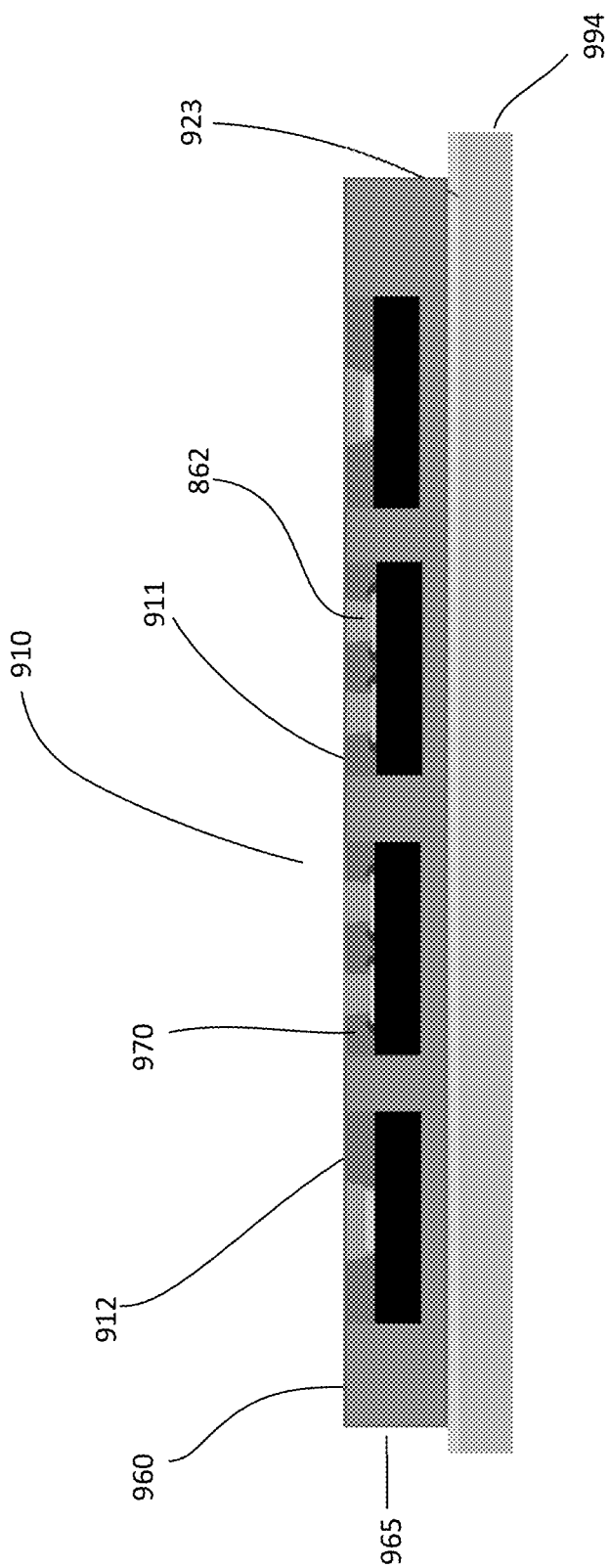
FIGS. 9a-9f show simplified cross-sectional views illustrating an embodiment of a process for forming traces on the reconstructed wafer.

FIGS. 9a-9e show simplified cross-sectional views of the carrier reconstructed wafer assembly illustrating an embodiment of a process for forming traces on the reconstructed wafer. Referring to FIG. 9a, a carrier reconstructed wafer assembly is shown. The carrier reconstructed wafer assembly includes the reconstructed wafer 965 attached to the carrier substrate 994 with the carrier tape 923. The reconstructed wafer includes the dies 910 encased in the mold compound 970. As shown, the simplified cross-section view of the reconstructed wafer 965 is of the row or column of the block of dies 910 which includes the alignment dies 912 and live dies 911. For example, the row or column may be the last or first row or column of the block. The alignment dies 912 are located at the end positions of the row or column of the block. The dies 910 include features which are openings 962 in the buffer layer 960 to expose the die bond pads of the dies 910. Illustratively, the features of alignment dies 912 are arranged differently than the features of the live dies 911. In other embodiments, the alignment dies 912 may be the same as the live dies 911.

Figure 9B:
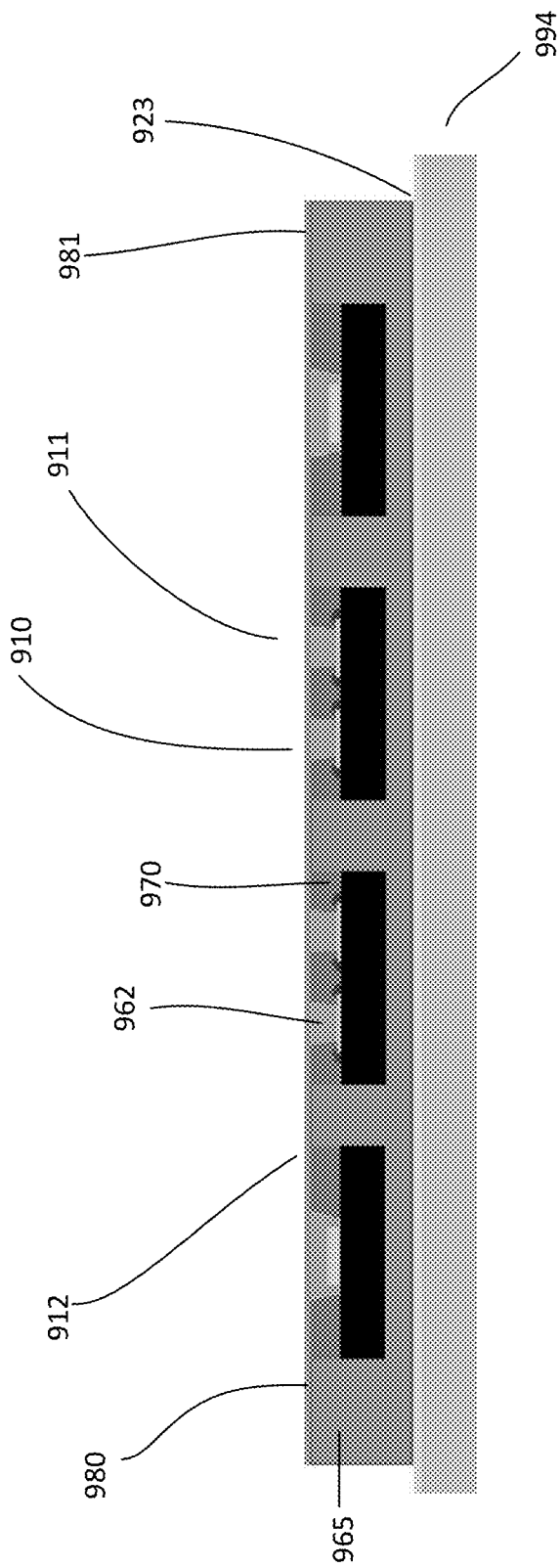

In FIG. 9b, a conductive or metal layer 980 is formed. The conductive layer 980, for example, may be a copper (Cu) layer. Other types of conductive layers may also be formed. The conductive metal layer 980, as shown, fills the via openings 962 of the dies 910. The conductive layer, for example, may be formed by a plating process. Other techniques may also be employed to form the conductive layer 980. The conductive layer 980 may be referred to as a conductive fill layer 980.

In one embodiment, a metal seed layer 981 is formed on the reconstructed wafer 965 with the conductive fill layer 980 filling the via openings 962. The seed layer, for example, may be a titanium (Ti) layer formed by sputtering. Other types of seed layers or techniques for forming the seed layer may also be useful.

Figure 9C:
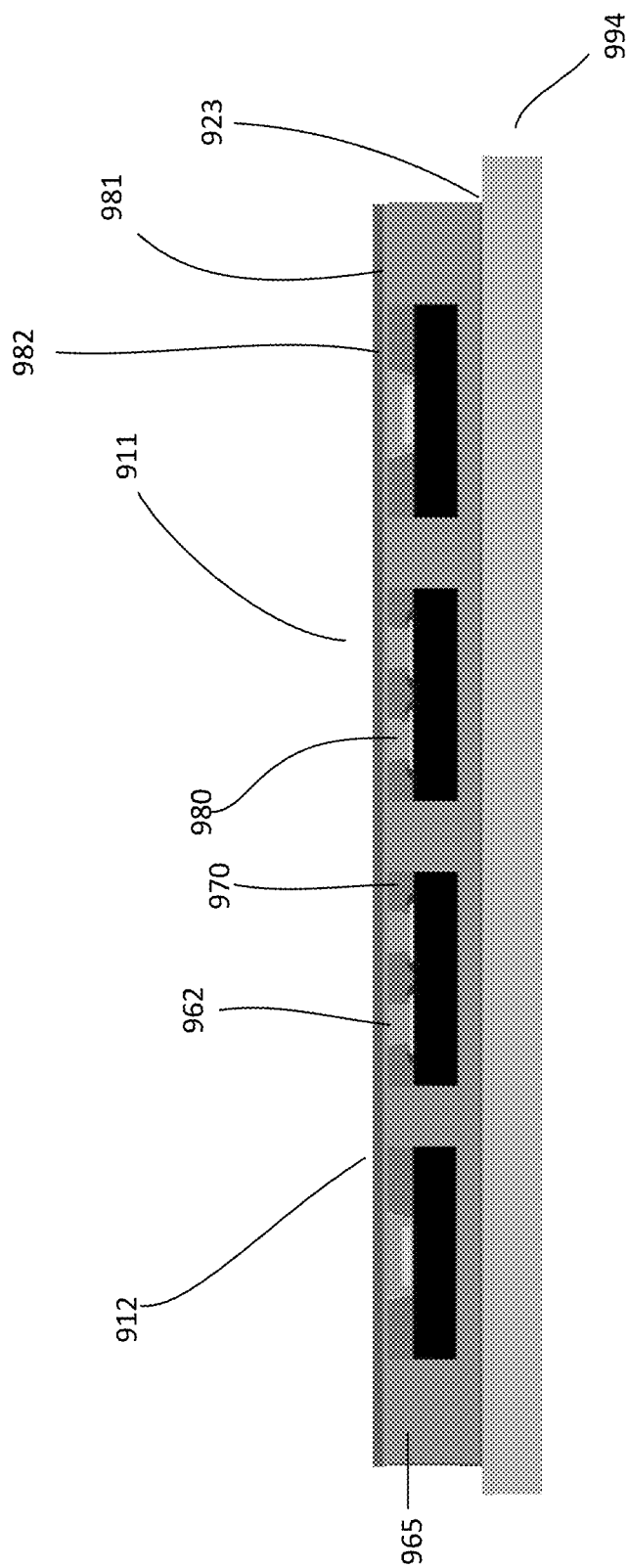

Referring to FIG. 9c, after the seed layer 981 is formed, a thin film 982 is formed over the surface of the reconstructed wafer 965 after removing the excess conductive layer 980. For example, the thin film 982 covers the seed layer 981. The thin film, in one embodiment, is a laser imageable thin film, such as a photoresist. The laser imageable thin film 982, in one embodiment, is a dry film 982 which is laminated onto the surface of the reconstructed wafer 965. Other types or techniques for forming the laser imageable thin film 982 may also be useful.

Figure 9D:
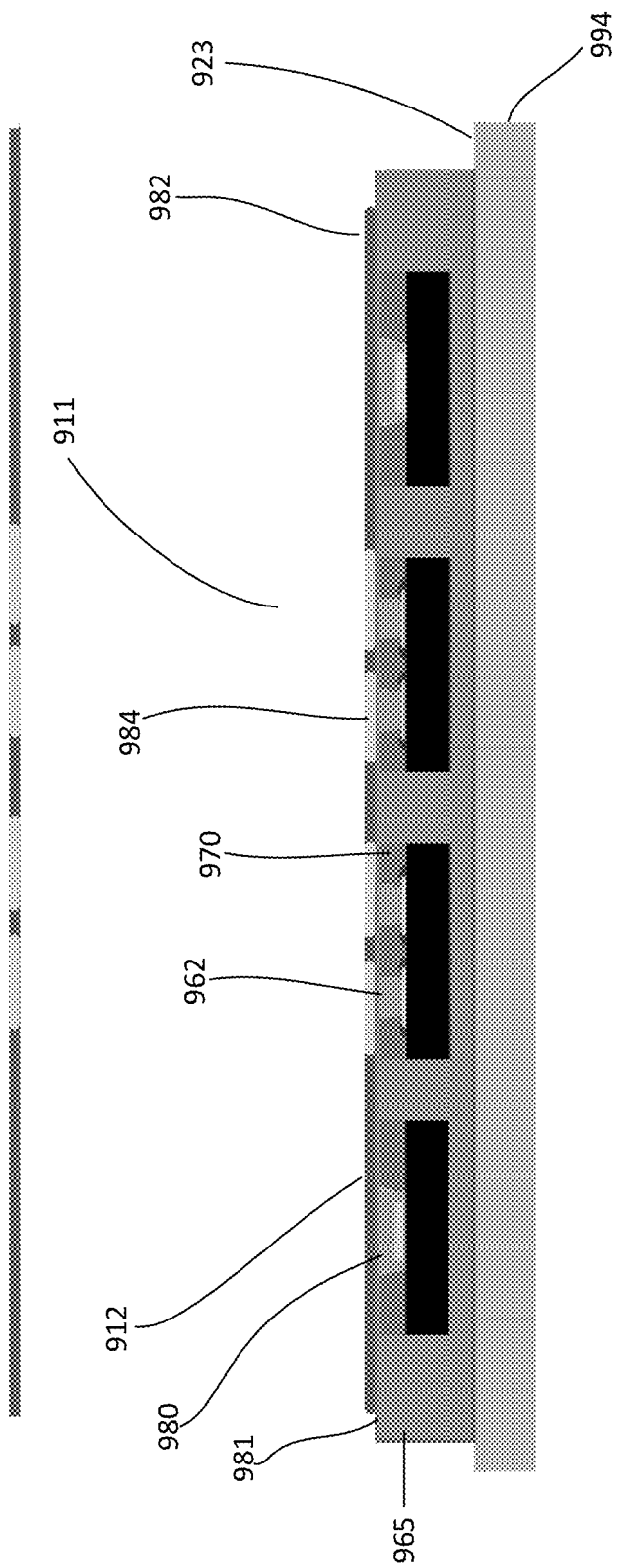

As shown in FIG. 9d, the thin film is patterned to form openings 984. In one embodiment, the pattern of the patterned dry film 982 corresponds to the circuit pattern or traces to be formed on the reconstructed wafer 965. In one embodiment, the dry film 982 is patterned using laser direct imaging (LDI) by the LDI tool. For example, the LDI tool exposes the dry film using a laser. The exposure has the desired pattern. The desired pattern, for example, is based on the LDI file. The LDI file, for example, is generated as described in FIG. 8c. In one embodiment, the LDI file is employed to form traces for the live dies 911 of the block. The LDI file may be employed to form other types of interconnections, such as redistribution layers (RDLs), for the live dies of the block. The exposed dry film 982 is developed to form the openings 984 therein.

Figure 9E:
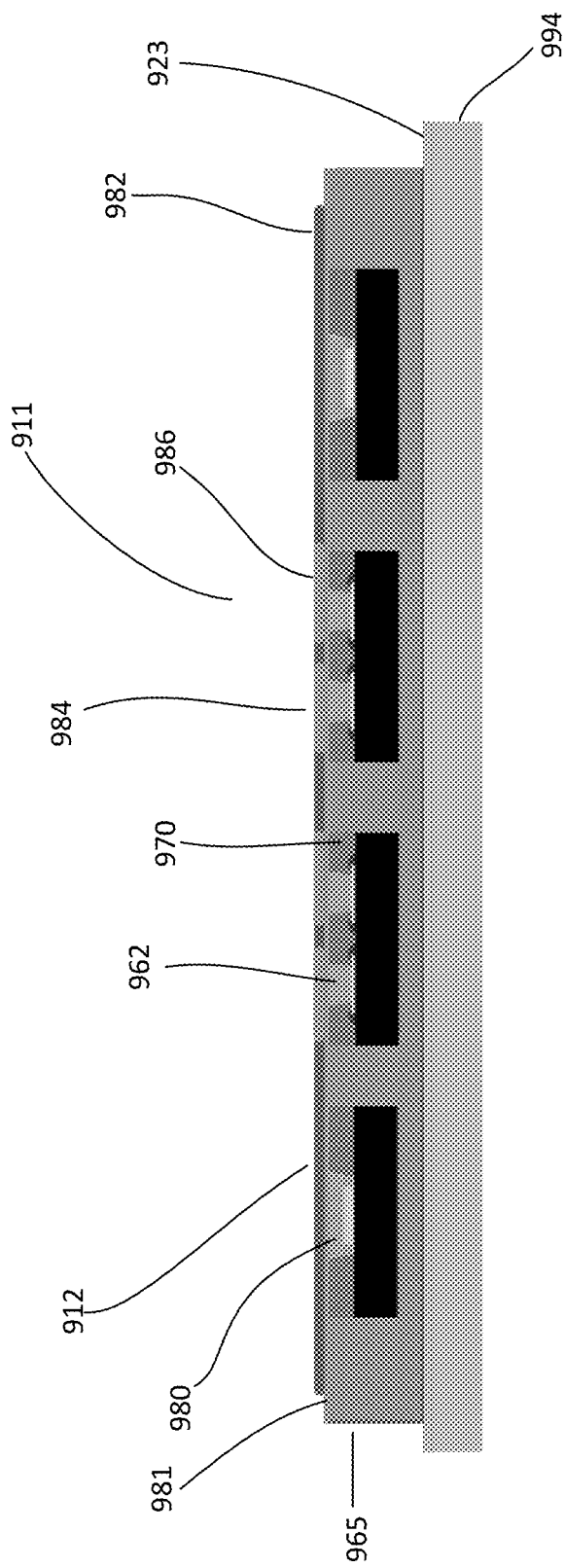

Referring to FIG. 9e, the process continues to form conductive traces 986 filling the openings 984 in the dry film 982. The conductive traces, for example, include Cu or Cu alloy. Other types of conductive traces 986 may also be useful. In one embodiment, the conductive traces 986 are formed by plating. The plating process fills the openings 984 in dry film 982. The plating process stops slightly below the height of the dry film 982. The plating process forms the conductive traces 986 in the openings 984 of the dry film 982. As shown, the dry film is patterned to expose the seed layer, for example, near the edge of the reconstructed wafer. This facilitates the plating process.

Figure 9F:
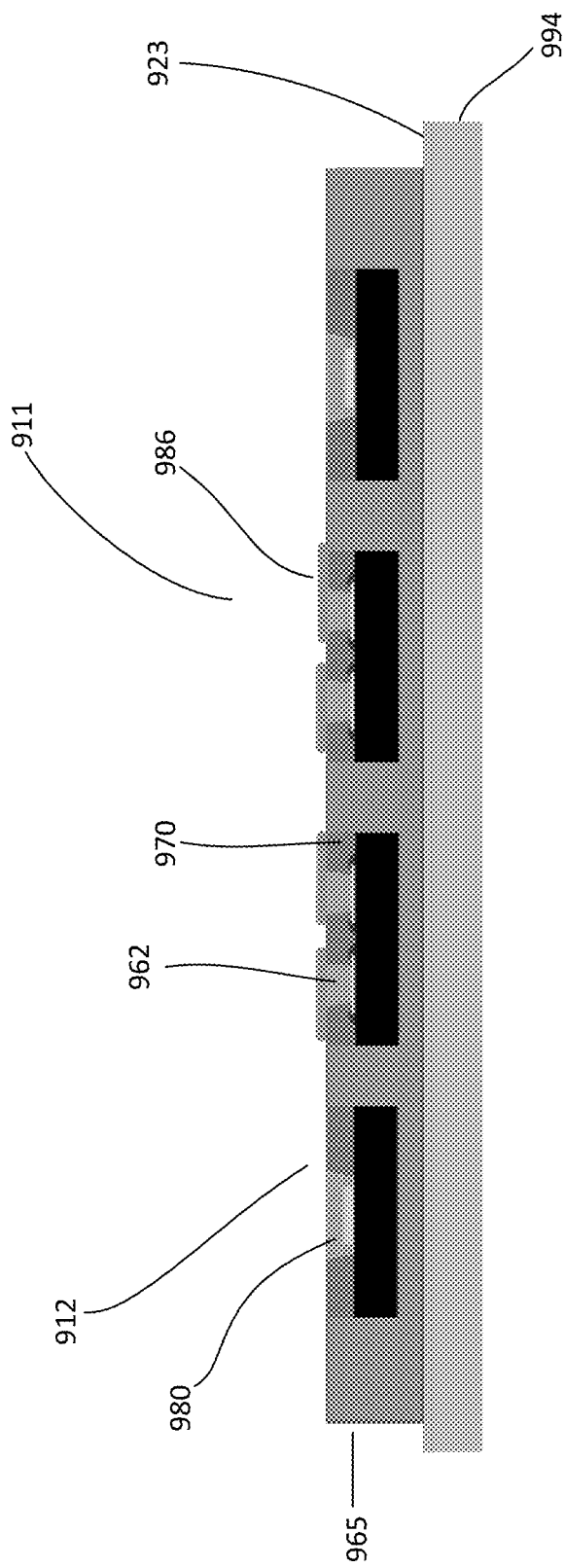

After forming the conductive traces 986, the dry film 982 is removed, as shown in FIG. 9f. The exposed portion of the seed layer is removed. For example, the seed layer may be removed using a dry etch. Other types of etch processes may also be employed to remove the exposed portions of the seed layer. After removing the exposed portions of the seed layer, the process may continue. For example, the process may continue to singulate the reconstructed wafer 965 into individual packages.

Alternatively, the process may continue to form additional metal layers of an RDL structure over the dies. For example, dry file, exposure and plating processes may be repeated until the RDL structure is completed. The reconstructed wafer 965 may be singulated into individual packages.

Figure 10A:
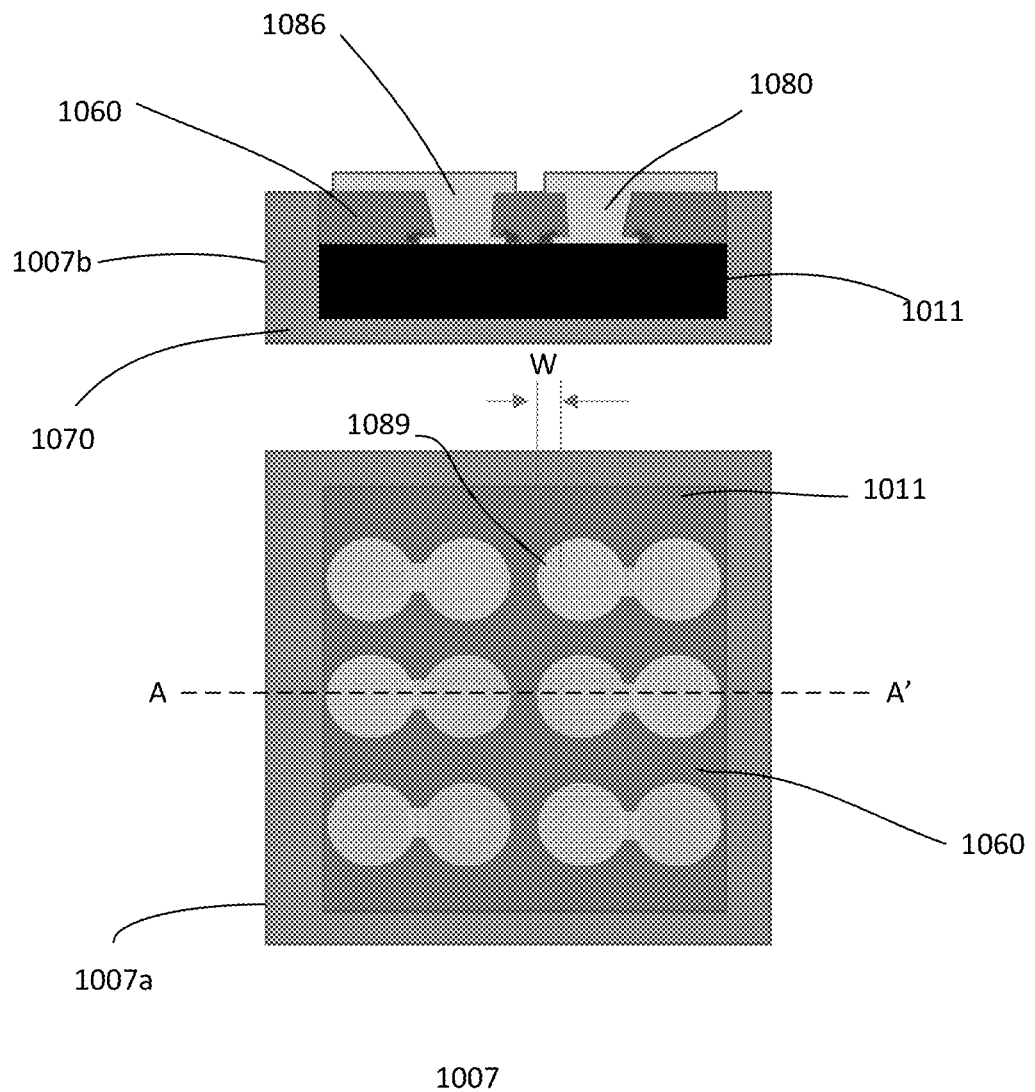
FIGS. 10a-10b show simplified top views of embodiments of packages with traces.
Figure 10B:
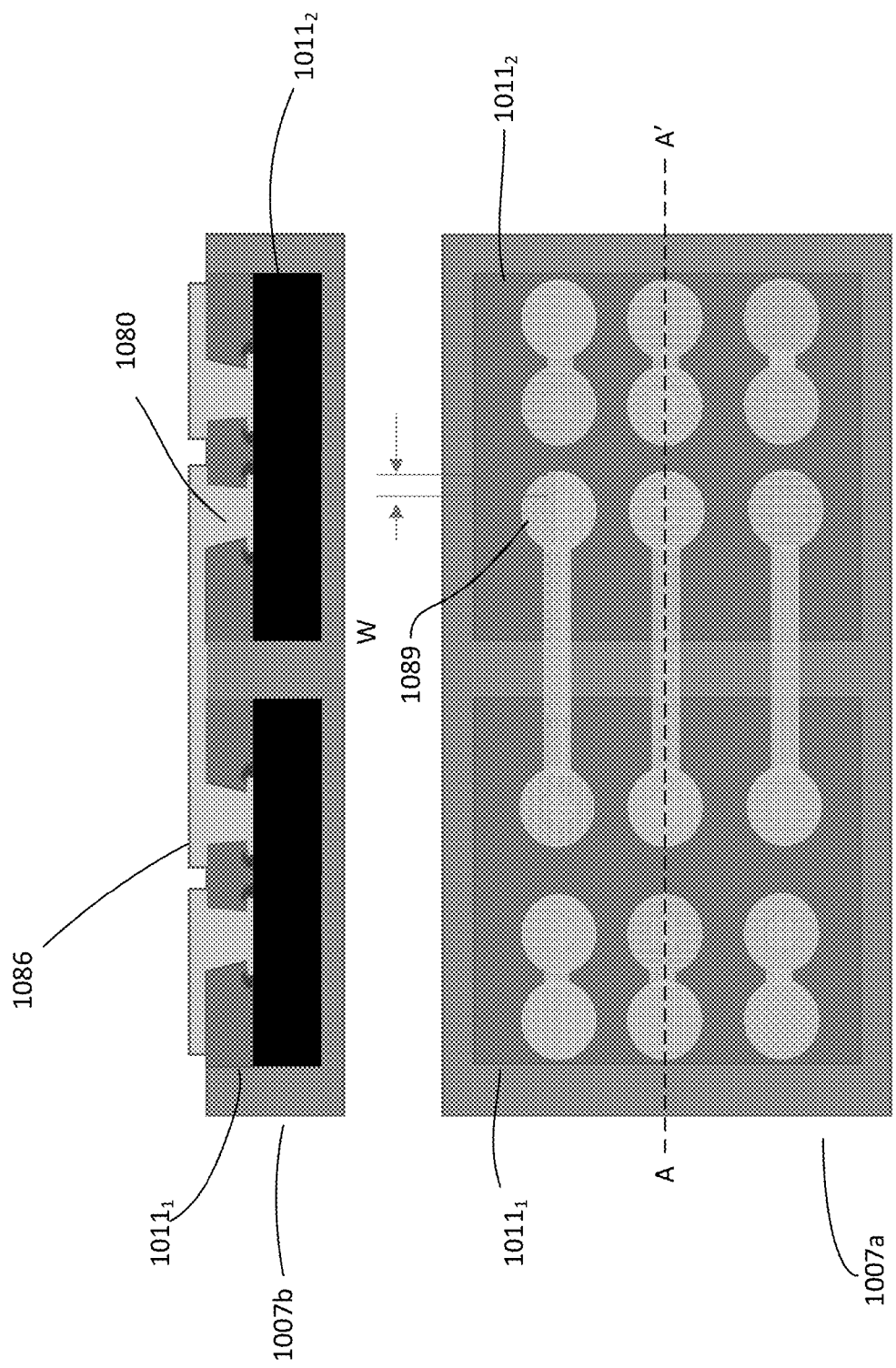

FIGS. 10a-10b show simplified cross-sectional and top views of exemplary embodiments of packages with conductive traces. Referring to FIG. 10a, the top view 1007a and a cross-sectional view 1007b of the package 1007 along A-A' are shown. As shown, the package 1007 includes a single die 1011. For example, the package 1007 is a single die package with one die 1011. The die 1011 is encased with the mold compound 1070. As shown, the inactive (without the buffer layer 1060) and side surfaces of the die 1011 and side surfaces of the buffer layer 1060 are protected by the mold compound 1070. As for the active surface of the die 1077, it is protected by the buffer layer 1060. Other arrangements of the package may also be useful.

The buffer layer 1060 includes via openings filled with the conductive fill 1080. The conductive filled via openings may be referred to as via contacts. In one embodiment, conductive traces 1086 are disposed above the via contacts. The pattern of the conductive traces 1086, for example, is defined by the LDI file. In one embodiment, the portion of the conductive traces 1086 over the conductive vias form annular rings 1089. The annular rings 1089 surround the circumference of the via contacts. In one embodiment, a width W of the annular rings 1089 is formed with high accuracy or tolerance. For example, the width W of the annular rings 1089 may be about 15 um. Other widths for the annular rings may also be useful. This enables a more compact layout of the die 1011, resulting in a smaller package footprint.

FIG. 10b show top view 1007a and a cross-sectional view 1007b along A-A' of another embodiment of the package 1007. The package 1007 is a multi-die package. As shown, the multi-die package 1007 includes first and second dies 1011$_{1-2}$. Providing other numbers of dies 1011 for the multi-die package 1007 may also be useful. The die 1011$_{1-2}$ are encased with the mold compound 1070. As shown, the inactive and side surfaces of the die 1011 and the buffer layer 1060 are protected by the mold compound 1070. As for the active surface of the dies 1011$_{1-2}$, it is protected by the buffer layer 1060. Other arrangements of the package may also be useful.

The buffer layer 1060 includes via openings filled with the conductive fill 1080. The conductive filled vias may be referred to as via contacts. In one embodiment, conductive traces 1086 are disposed above the via contacts. The pattern of the conductive traces 1086, for example, is defined by the LDI file. The pattern of the conductive traces includes interconnections between the first and second dies 1011$_{1-2}$. For example, conductive traces may interconnect via contacts of first and second dies 1011$_{1-2}$. In one embodiment, the portion of the conductive traces over the via contacts form annular rings 1089. The annular rings 1089 surround the circumference of the via contacts. In one embodiment, a width W of the annular rings 1089 is formed with high accuracy or tolerance. For example, the width W of the annular rings 1089 is about 15 um. This enables a more compact layout of the dies 1011$_{1-2}$, resulting in a smaller package footprint.

Figure 11A:
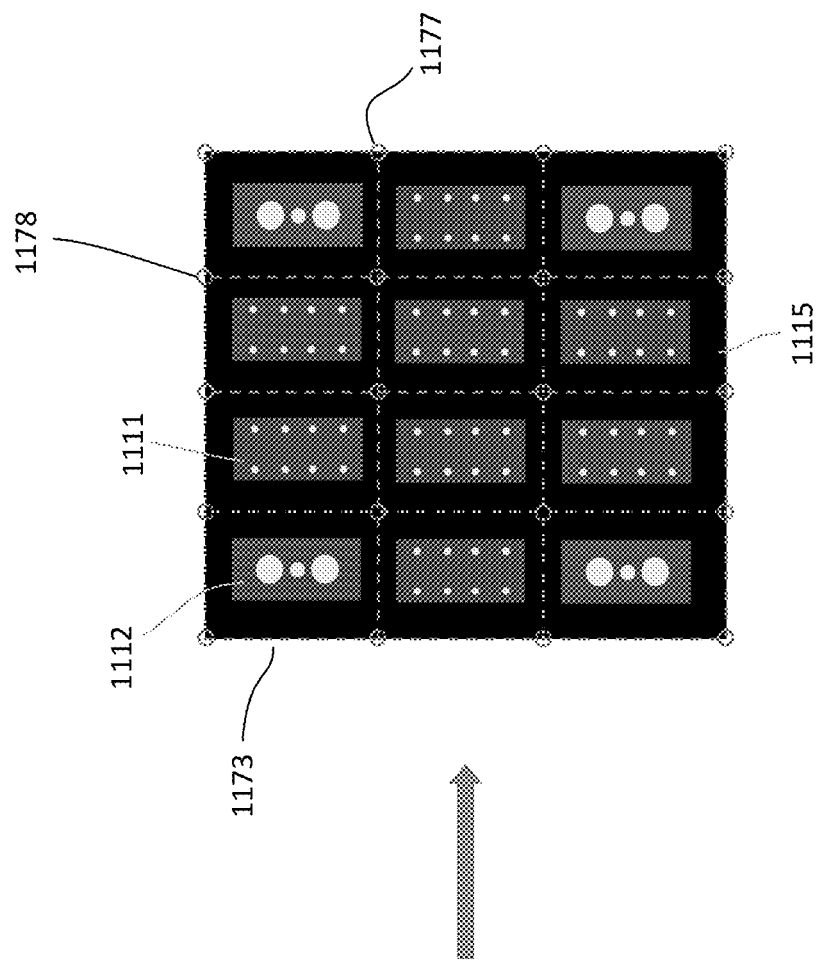
FIGS. 11a-11b show embodiments of generating saw line fiducials for dicing the reconstructed wafer.
Figure 11A:
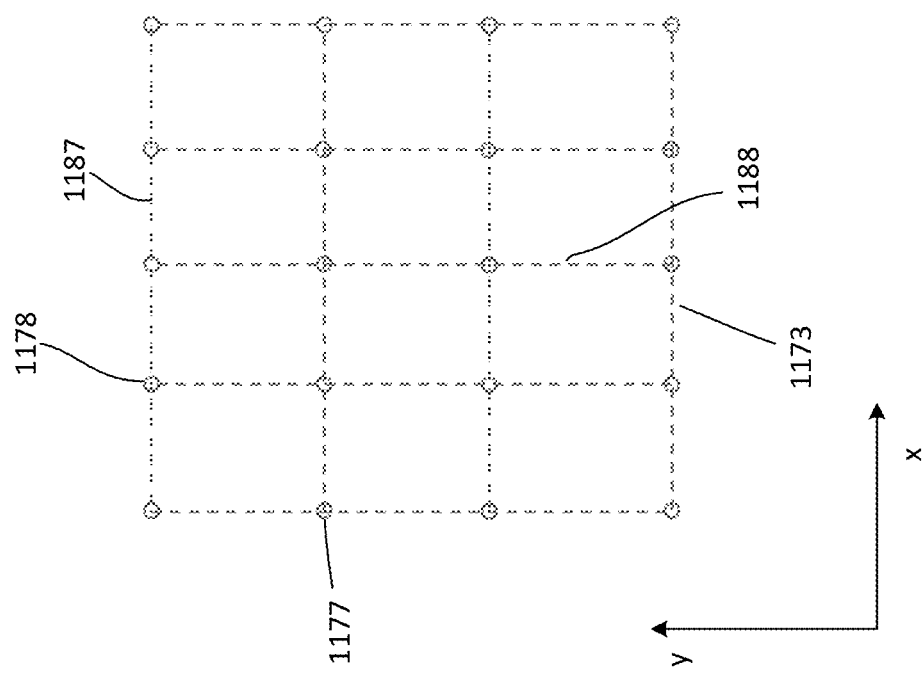
Figure 11B:
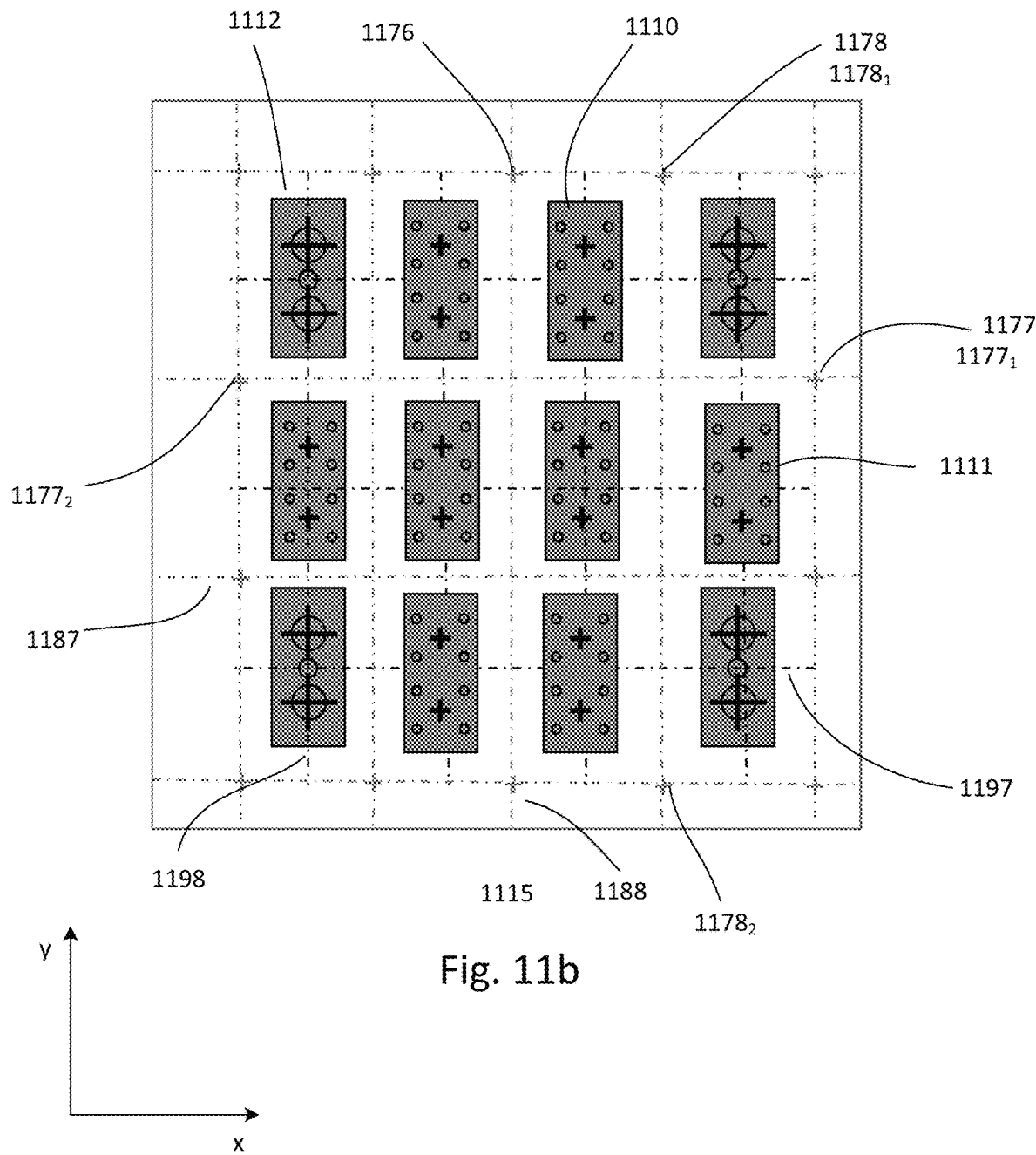

FIGS. 11a-11b show embodiments of defining dicing or sawing lines for the reconstructed wafer. Referring to FIG. 11a, a dicing or saw line grid 1173 is generated for the block of dies of the reconstructed wafer.

The saw line grid 1173 is created using the average x and y values of the dies of each row and column of dies of the block. For example, the saw line grid 1173 is created using the average x and y values of adjacent rows and columns of dies of the block. In one embodiment, the average x and y values are based on measured x and y values of the rows and columns of dies of the block. The x saw lines 1187 are based on measured y values of dies of adjacent rows of dies and the y saw lines 1188 are based on the measure x values of dies of adjacent columns of dies. In one embodiment, x saw line fiducials 1177 are based on the measured y values of dies of adjacent rows of dies and the y saw line fiducials 1178 are based on measured x values of dies of adjacent columns of dies. The x and y fiducials 1177 and 1178 define the x and y saw lines 1187 and 1188 of the block, forming the saw line grid 1173. The saw line grid 1173, for example, may be referred to as a dynamic saw line grid since the pitch may vary based on the measured values of the rows and columns of dies.

In one embodiment, the saw line grid 1173 is best fitted to the block 1115 of the dies 1110. In one embodiment, the saw line grid 1173 is best fitted to the block 1115. The positions of the x and y saw street fiducials 1177 and 1178 are determined with respect to the origin point of the block 1115. The x and y saw street fiducials are provided in an e-map file of the block 1115. The e-map file may be incorporated into the LDI file with the circuit patterns to form saw street fiducials during trace making. The physical saw street fiducials on the reconstructed wafer may be identified by a saw tool during the singulation process for the reconstructed wafer.

In another embodiment, the saw line grid may be based on measured values of the sub-blocks of the block. For example, based on the sub-block coordinate points of each sub-block, the average x and y values of each row and column can be extrapolated to generate the saw line grid 1173. The saw line grid is then bested fitted to the block 1115 to generate the x and y saw street fiducials which are provided in the e-map file of the block 1115.

Referring to FIG. 11b, another embodiment of determining saw lines for the block 1115 of the reconstructed wafer. The block 1115 includes the dies 1110 arranged in rows and columns. The dies 1110 of the block 1115, for example, are arranged in a 3×4 matrix. Other sized matrices may also be useful. As shown, the dies 1110 include the alignment dies 1112 disposed at corner positions of the block 1115. The remaining positions of the block 1115 include the live dies 1111.

In one embodiment, the saw lines are determined based on an averaging technique. The averaging technique, for example, is employed when one saw line is located between adjacent rows or adjacent columns of dies. The averaging technique includes generating x mean lines 1197 and y mean lines 1198 for each column and row of dies. The mean lines are generated using the center of all the dies 1110. For example, the centers of the dies 1110 in each row are connected in the row or x direction to form row or x mean lines 1197; the centers of the dies 1110 in each column are connected in the column or y direction to form column or y mean lines 1198.

Saw line fiducials 1176 are disposed at the midpoint of two adjacent mean lines. For example, x saw line fiducials 1177 are disposed at the midpoint between two adjacent x mean lines 1197; y saw line fiducials 1178 are disposed at the midpoint between two adjacent y mean lines 1198. The saw line fiducials 1176 define the positions of the saw lines. As shown, each saw line position is defined by 2 fiducials 1176. For example, each x saw line 1187 is defined by first and second x saw line fiducials 1177$_{1-2}$ and each y saw line 1188 is defined by first and second y saw line fiducials $1178_{1-2}$. As shown, the first and second saw line fiducials are located at about the ends of the saw lines.

In one embodiment, the number of x saw lines is equal to the number of rows in the block plus 1 and the number of y saw lines is equal to the number of columns in the block plus 1. In one embodiment, the x saw lines are parallel to each other and the y saw lines are parallel to each other. Since the mean x and y lines are based on the actual measured locations of the dies 1110 of the block 1115, the x and y saw lines can have variable pitches. The x and y saw line fiducials 1177 and 1178 are provided in an e-map file. The e-map file may be incorporated into the LDI file with the circuit patterns to form saw street fiducials during trace making. The physical saw street fiducials on the reconstructed wafer may be identified by a dicing tool during the singulation process for the reconstructed wafer.

In another embodiment, the saw line grid may be based on measured values of the sub-blocks of the block 1115. For example, based on the sub-block coordinate points of each sub-block, the mean lines 1197 and 1198 of the dies can be extrapolated to generate the saw line fiducials 1777 and 1178.

The present disclosure may be embodied in other specific forms without departing from the spirit or essential characteristics thereof. The foregoing embodiments, therefore, are to be considered in all respects illustrative rather than limiting the invention described herein. The scope of the invention is thus indicated by the appended claims, rather than by the foregoing description, and all changes that come within the meaning and range of equivalency of the claims are intended to be embraced therein.

What is claimed is:

1. A method for a die location check (DLC) comprising:
   providing a reconstructed wafer having a block of dies encased in a mold compound, the block of dies includes a plurality of dies arranged in rows and columns to form a matrix of dies of the block, wherein the plurality of dies includes alignment dies and live dies;
   scanning the reconstructed wafer, wherein the scanning comprises scanning the block of dies; and
   processing scan information of the block of dies, wherein the processing comprises
      identifying positions of the alignment dies of the block of dies,
      assigning one of the alignment dies of the block of dies as an origin point of a Cartesian coordinate system of the block of dies,
      wherein scanning the block of dies includes scanning sub-blocks of dies one sub-block at a time, wherein each sub-block of dies includes the dies arranged in a sub-block matrix, the sub-block matrix includes a smaller number of dies than the matrix of the block of dies, and
      assigning coordinate points for the sub-blocks of dies in the Cartesian coordinate system.

2. The method of claim 1 wherein the coordinate points of the sub-blocks of dies are with respect to the origin point.

3. The method of claim 2 wherein the sub-block matrix of each sub-block of dies is the same.

4. The method of claim 1 wherein the sub-blocks of dies include local alignment dies, and locations of the local alignment dies in the Cartesian coordinate system are the coordinate points for the sub-blocks of dies.

5. The method of claim 1 wherein the reconstructed wafer comprises a plurality of blocks of dies encased in the mold compound.

6. The method of claim 1 wherein the reconstructed wafer comprises a plurality of blocks of dies encased in the mold compound, the blocks of dies are arranged in a block matrix.

7. The method of claim 1 wherein the reconstructed wafer comprises 4 blocks arranged in a 2×2 matrix of blocks.

8. The method of claim 6 wherein scanning the reconstructed wafer comprises:
   scanning the reconstructed wafer with at least first and second cameras covering first and second areas of the reconstructed wafer, wherein the first camera covers the first area having a first block of the block matrix and the second camera covers the second area having a second block of the block matrix; and
   processing scan information of the first and second blocks in parallel to
      identify positions of alignment dies of the first and second blocks,
      assign one alignment die of the first and second blocks as an origin point of the Cartesian coordinate system of the first and second blocks,
      wherein scanning the first and second blocks includes scanning sub-blocks of dies in the first and second blocks one sub-block at a time, and
      assigning coordinate points for the sub-blocks of dies in the Cartesian coordinate system.

9. The method of claim 1 wherein assigning the coordinate points for the sub-blocks of dies comprises defining sub-block reference points for the sub-blocks of dies, wherein:
   the sub-block reference points are located in a predefined position of each sub-block of dies, and
   the sub-block reference points are the coordinate points of the sub-blocks of dies which are with respect to the origin point.

10. The method of claim 1 further comprises generating a laser direct imaging (LDI) file for downstream processing of traces of the reconstructed wafer.

11. The method of claim 10 wherein generating the LDI file comprises:
    providing a computer-aided design (CAD) circuit sub-block file comprising
    CAD circuit information for the dies of one CAD sub-block according to their designed locations of the dies of the sub-blocks of dies of the reconstructed wafer, and
    a CAD sub-block reference point, the CAD sub-block reference point corresponding to the coordinate points of each sub-block of dies; and
    aligning the CAD sub-block reference point of the CAD circuit sub-block file with the coordinate points of the sub-block of dies to produce the LDI file.

12. The method of claim 1 wherein providing the reconstructed wafer comprises:
    providing an alignment panel having a bonding surface which includes die bonding regions for bonding the dies thereto, wherein the bonding surface includes local alignment marks, wherein the bonding surface includes a panel adhesive film for facilitating bonding the dies to the die bonding regions;
    aligning a selected die to a selected die bonding region using the local alignment marks of the selected die bonding region:
    bonding the selected die to the selected die bonding region when the selected die is aligned to the selected die bonding region; and
    encasing the dies bonded to the alignment panel with the mold compound to form the reconstructed wafer.

13. The method of claim 1 wherein scanning the reconstructed wafer further comprises:
- determining positions of all the dies of the reconstructed wafer with respect to the origin point in the Cartesian coordinate system;
- calculating x saw lines in a x direction of the Cartesian coordinate system between two adjacent rows of the dies; and
- calculating y saw lines in a y direction of the Cartesian coordinate system between two adjacent columns of the dies.

14. The method of claim 13 wherein determining the positions of all the dies of the reconstructed wafer comprises:
- calculating an x mean line for each row of the dies in the block of dies;
- disposing x saw line fiducials at midpoints of two adjacent x mean lines, the x saw line fiducials corresponding to the x saw lines of the reconstructed wafer;
- calculating a y mean line for each column of the dies in the block of dies; and
- disposing y saw line fiducials at midpoints of two adjacent y mean lines, the y saw line fiducials corresponding to the y saw lines of the reconstructed wafer.

15. The method of claim 13 wherein determining the positions of all the dies of the reconstructed wafer comprises:
- generating a dynamic saw line grid using average x values of all dies and average y values of all dies in the Cartesian coordinate system; and
- best fitting the dynamic saw line grid to the reconstructed wafer by die position.

16. A method of bonding dies for panel level processing comprising
- providing an alignment panel having a bonding surface which includes die bonding regions for bonding dies thereto, wherein the bonding surface includes local alignment marks, wherein the bonding surface includes a panel adhesive film for facilitating bonding the dies to the die bonding regions; and
- bonding a selected die to a selected die bonding region comprising
  - aligning the selected die to the selected die bonding region using the local alignment marks of the selected die bonding region, and
  - bonding the selected die to the selected die bonding region when the selected die is aligned to the selected die bonding region,
- wherein aligning the selected die to the selected die bonding region comprises
  - providing a computer-aided design (CAD) die file with die features corresponding to selected die features on a surface of the selected die and a defined CAD die reference point;
  - providing a CAD panel file with panel features corresponding to the local die alignment marks of the selected die bonding region and a defined CAD panel reference point;
  - imaging the surface of the selected die with the selected die features by a camera model and best fitting the CAD die file to the surface of the selected die;
  - imaging the selected die bonding region with the local alignment marks and best fitting the CAD panel file to the selected die bonding region; and
  - aligning the selected die to the selected die bonding region by aligning the CAD die reference point best fitted to the selected die to the CAD panel reference point best fitted to the selected die bonding region.

17. The method of claim 16 wherein:
- the computer-aided design (CAD) die reference point comprises first and second CAD die reference points; and
- the CAD panel reference point comprises first and second CAD panel reference points, wherein providing the first and second CAD die reference points and the CAD first and second panel reference points enables translational and angular alignment of the selected die to the selected die bonding region.

18. The method of claim 16 wherein bonding the selected die to the selected die bonding region comprises:
- bonding a next selected die to a next selected die bonding region of the alignment panel; and
- repeating bonding the next selected die to the next selected die bonding region until all the die bonding regions of the alignment panel are bonded with the dies.

19. The method of claim 18 further comprising encasing the dies bonded to the die bonding regions of the alignment panel with a mold compound to form a reconstructed wafer.

* * * * *